United States Patent
Kodama et al.

(10) Patent No.: US 12,235,770 B2
(45) Date of Patent: Feb. 25, 2025

(54) FAILURE ANALYSIS SYSTEM OF SEMICONDUCTOR DEVICE, FAILURE ANALYSIS METHOD OF SEMICONDUCTOR DEVICE, AND NON-TRANSITORY COMPUTER READABLE MEDIUM

(71) Applicant: Kioxia Corporation, Tokyo (JP)

(72) Inventors: Mami Kodama, Yokohama (JP); Yoshikazu Iizuka, Kawasaki (JP); Masahiro Noguchi, Shinagawa (JP); Yumiko Watanabe, Yokohama (JP)

(73) Assignee: Kioxia Corporation, Tokyo (JP)

( * ) Notice: Subject to any disclaimer, the term of this patent is extended or adjusted under 35 U.S.C. 154(b) by 795 days.

(21) Appl. No.: 17/180,919

(22) Filed: Feb. 22, 2021

(65) Prior Publication Data

US 2022/0066854 A1    Mar. 3, 2022

(30) Foreign Application Priority Data

Aug. 27, 2020   (JP) ................. 2020-143635

(51) Int. Cl.
    *G06F 12/10*      (2016.01)
    *G05B 23/02*      (2006.01)

(52) U.S. Cl.
    CPC ......... *G06F 12/10* (2013.01); *G05B 23/0264* (2013.01); *G05B 23/0272* (2013.01)

(58) Field of Classification Search
    CPC .. G06F 12/10; G05B 23/0264; G05B 23/0272
    See application file for complete search history.

(56) References Cited

U.S. PATENT DOCUMENTS 5,787,190 A *    7/1998   Peng ..................... H01L 22/20
                                                                   438/10
6,349,240 B2      2/2002   Ogawa et al.
(Continued)

FOREIGN PATENT DOCUMENTS

JP        3555859 B2     8/2004
JP     2011-123973 A     6/2011
(Continued)

OTHER PUBLICATIONS

J. Segal, A. Jee, D. Lepejian and B. Chu, "Using electrical bitmap results from embedded memory to enhance yield," in IEEE Design & Test of Computers, vol. 18, No. 3, pp. 28-39, May-Jun. 2001, doi: 10.1109/54.922801. (Year: 2001).*

(Continued)

*Primary Examiner* — Raymond L Nimox
(74) *Attorney, Agent, or Firm* — Oblon, McClelland, Maier & Neustadt, L.L.P.

(57) ABSTRACT

According to one embodiment, the failure analysis system of the semiconductor device includes a memory, a failure information management table, and an analyzing unit. The memory stores normal/failure information collected in a block unit and a column unit in a chip, in a plurality of inspection processes of the semiconductor memory. The failure information management table stores the normal/failure information in the block unit and the column unit stored in the memory, with an addition of product information, fabricating information including a lot number, a wafer number, and a chip address, process information, and test information, which are common information ranging over the inspection processes. The analyzing unit analyzes the normal/failure information in the block unit and the column unit ranging over the plurality of inspection processes, on (Continued)

the basis of the information stored in the failure information management table.

18 Claims, 25 Drawing Sheets

(56) References Cited

U.S. PATENT DOCUMENTS

| | | | |
|---|---|---|---|
| 6,757,621 B2 | 6/2004 | Mizuno et al. | |
| 8,396,582 B2 | 3/2013 | Kaushal et al. | |
| 8,744,607 B2 | 6/2014 | Kaushal et al. | |
| 9,128,143 B2 | 9/2015 | Kodama et al. | |
| 9,424,528 B2 | 8/2016 | Kaushal et al. | |
| 2001/0000460 A1* | 4/2001 | Ishihara | H01L 22/20 257/E21.525 |
| 2002/0059010 A1* | 5/2002 | Ogawa | H01L 22/20 700/121 |
| 2004/0049722 A1* | 3/2004 | Matsushita | G11C 29/006 714/724 |
| 2007/0247937 A1* | 10/2007 | Moriyama | G11C 29/56008 365/200 |
| 2008/0163140 A1 | 7/2008 | Fouquet et al. | |
| 2014/0043360 A1* | 2/2014 | Kodama | G11C 29/006 702/58 |
| 2018/0129559 A1* | 5/2018 | Kim | G11C 29/48 |
| 2020/0003832 A1* | 1/2020 | Nishimura | G01R 31/2894 |

FOREIGN PATENT DOCUMENTS

| | | |
|---|---|---|
| JP | 6461831 B2 | 1/2019 |
| TW | I525407 B | 3/2016 |

OTHER PUBLICATIONS

J. Vollrath and R. Rooney, "Pseudo fail bit map generation for RAMs during component test and burn-in in a manufacturing environment," Proceedings International Test Conference 2001 (Cat. No.01CH37260), Baltimore, MD, USA, 2001, pp. 768-775, doi: 10.1109/TEST.2001.966698. (Year: 2001).*

N. Campanelli et al., "Cumulative embedded memory failure bitmap display & analysis," 13th IEEE Symposium on Design and Diagnostics of Electronic Circuits and Systems, Vienna, Austria, 2010, pp. 1-6, doi: 10.1109/DDECS.2010.5654683. (Year: 2010).*

* cited by examiner

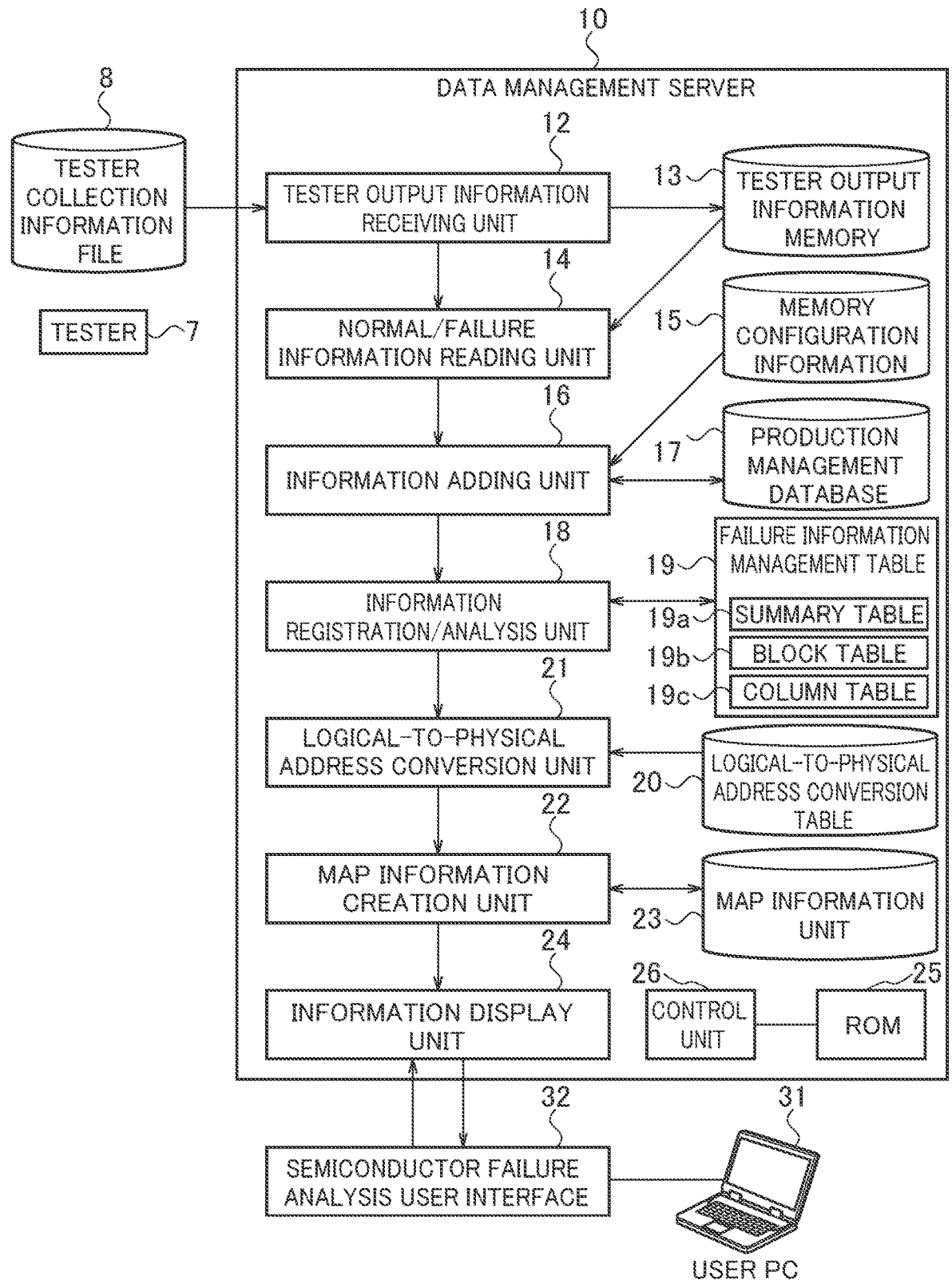

FIG. 4

| ORDER | TEST NAME | TEST TYPE | TEST CLASSIFICATION |
|---|---|---|---|
| 1 | POWER SOURCE TEST PT1 | COLUMN | FORMAL |
| 2 | POWER SOURCE TEST PT2 | COLUMN | FORMAL |
| 3 | DATA TRANSFER TEST DT1 | COLUMN | FORMAL |
| 4 | DATA TRANSFER TEST DT2 | COLUMN | FORMAL |
| 5 | LEAKAGE TEST LT1 | COLUMN | FORMAL |
| 6 | LEAKAGE TEST LT2 | COLUMN | MONITOR |
| 7 | LEAKAGE TEST LT3 | BLOCK | FORMAL |
| 8 | LEAKAGE TEST LT4 | BLOCK | FORMAL |
| 9 | LEAKAGE TEST LT5 | BLOCK | MONITOR |
| 10 | LEAKAGE TEST LT6 | BLOCK | MONITOR |
| 11 | OPEN TEST OT1 | BLOCK | FORMAL |
| 12 | OPEN TEST OT2 | BLOCK | FORMAL |
| 13 | ERASING TEST ET1 | BLOCK | FORMAL |
| 14 | ERASING TEST ET2 | BLOCK | FORMAL |
| 15 | PROGRAM TEST PRT1 | BLOCK | FORMAL |
| 16 | PROGRAM TEST PRT2 | BLOCK | FORMAL |

FIG. 6

```
PRODUCT A   LOT L1     WAFER W1    INSPECTION IN PRE-PROCESS

TEST BA   2019.9.1  10:00:01
   CHIP X = CX5   CHIP Y = CY5   PLANE = P0   THE NUMBER OF FAILURES = 4    FAIL BLOCK ADDRESS= Bad100, Bad102, Bad104, Bad108
   CHIP X = CX5   CHIP Y = CY5   PLANE = P1   THE NUMBER OF FAILURES = 1    FAIL BLOCK ADDRESS= Bad203
   CHIP X = CX5   CHIP Y = CY5   PLANE = P0   THE NUMBER OF FAILURES = 16   FAIL BLOCK ADDRESS= Bad20, Bad22, Bad32, Bad38, Bad40, ...
   ...

TEST BB   2019.9.1  10:04:10
   CHIP X = CX5   CHIP Y = CY5   PLANE = P0   THE NUMBER OF FAILURES = 821  FAIL BLOCK ADDRESS = Bad108, Bad202, Bad204, Bad208, ...
   CHIP X = CX5   CHIP Y = CY5   PLANE = P1   THE NUMBER OF FAILURES = 0    FAIL BLOCK ADDRESS =
   ...

TEST CA   2019.9.1  10:17:02
   CHIP X = CX5   CHIP Y = CY5   PLANE = P0   THE NUMBER OF FAILURES = 37   FAIL COLUMN ADDRESS = Cad1001, Cad202, Cad204, Cad208, ...
   ...
```

FIG. 7A

| PRODUCT | LOT | WAFER | CHIP X | CHIP Y | PLANE | PROCESS STEPS | BLOCK/ COLUMN | TEST | TEST CLASSIFI -CATION | STARTING DATE AND TIME OF INSPECTION | THE NUMBER OF FAILURES |
|---|---|---|---|---|---|---|---|---|---|---|---|
| PRODUCT A | LOT1 | WAFER W1 | CX5 | CY5 | P0 | PRE-PROCESS | blk | TEST BA | FORMAL | 2019.9.1 10:00:01 | 4 |
| PRODUCT A | LOT1 | WAFER W1 | CX5 | CY5 | P1 | PRE-PROCESS | blk | TEST BA | FORMAL | 2019.9.1 10:00:01 | 1 |
| PRODUCT A | LOT1 | WAFER W1 | CX5 | CY6 | P0 | PRE-PROCESS | blk | TEST BA | FORMAL | 2019.9.1 10:00:01 | 16 |
| PRODUCT A | LOT1 | WAFER W1 | CX5 | CY6 | P1 | PRE-PROCESS | blk | TEST BA | FORMAL | 2019.9.1 10:00:01 | 250 |
| PRODUCT A | LOT1 | WAFER W1 | CX5 | CY7 | P0 | PRE-PROCESS | blk | TEST BA | FORMAL | 2019.9.1 10:00:01 | 1 |
| PRODUCT A | LOT1 | WAFER W1 | ... | ... | ... | PRE-PROCESS | blk | TEST BA | FORMAL | 2019.9.1 10:00:01 | ... |
| PRODUCT A | LOT1 | WAFER W1 | CX5 | CY5 | P0 | PRE-PROCESS | blk | TEST BB | MONITOR | 2019.9.1 10:04:10 | 51 |
| PRODUCT A | LOT1 | WAFER W1 | ... | ... | ... | PRE-PROCESS | col | TEST CA | FORMAL | 2019.9.1 10:17:02 | 37 |
| PRODUCT A | LOT1 | WAFER W1 | ... | ... | ... | ... | ... | ... | | ... | ... |
| PRODUCT A | LOT1 | WAFER W1 | CX5 | CY5 | P0 | POST-PROCESS | blk | TEST ba | FORMAL | 2019.9.5 04:00:04 | 48 |
| PRODUCT A | LOT1 | WAFER W1 | CX5 | CY5 | P1 | POST-PROCESS | blk | TEST ba | FORMAL | 2019.9.5 04:01:00 | 560 |
| PRODUCT A | LOT1 | WAFER W1 | CX5 | CY6 | P0 | POST-PROCESS | blk | TEST ba | FORMAL | 2019.9.5 04:01:00 | 10 |
| PRODUCT A | LOT1 | WAFER W1 | CX5 | CY6 | P1 | POST-PROCESS | blk | TEST ba | FORMAL | 2019.9.5 04:01:00 | 12 |
| PRODUCT A | LOT1 | WAFER W1 | CX5 | CY7 | P0 | POST-PROCESS | blk | TEST ba | FORMAL | 2019.9.5 04:01:00 | 8 |
| PRODUCT A | LOT1 | WAFER W1 | ... | ... | ... | POST-PROCESS | blk | TEST ba | FORMAL | 2019.9.5 04:01:00 | ... |
| PRODUCT A | LOT1 | WAFER W1 | CX5 | CY5 | P0 | POST-PROCESS | blk | TEST bb | MONITOR | 2019.9.5 04:01:00 | 108 |
| PRODUCT A | LOT1 | WAFER W1 | ... | ... | ... | POST-PROCESS | col | TEST ca | FORMAL | 2019.9.5 04:01:00 | ... |
| PRODUCT A | LOT1 | WAFER W1 | ... | ... | ... | ... | ... | ... | | ... | ... |
| PRODUCT B | ... | ... | ... | ... | ... | ... | ... | ... | | ... | ... |

FIG. 7B

| PRODUCT | LOT | WAFER | CHIP X | CHIP Y | PLANE | PROCESS STEPS | TEST | TEST CLASSIFICATION | FAIL BLOCK LOGICAL ADDRESS |
|---|---|---|---|---|---|---|---|---|---|
| PRODUCT A | LOT L1 | WAFER W1 | CX5 | CY5 | P0 | PRE-PROCESS | TEST BA | FORMAL | 100 |
| PRODUCT A | LOT L1 | WAFER W1 | CX5 | CY5 | P0 | PRE-PROCESS | TEST BA | FORMAL | 102 |
| PRODUCT A | LOT L1 | WAFER W1 | CX5 | CY5 | P0 | PRE-PROCESS | TEST BA | FORMAL | 104 |
| PRODUCT A | LOT L1 | WAFER W1 | CX5 | CY5 | P0 | PRE-PROCESS | TEST BA | FORMAL | 208 |
| PRODUCT A | LOT L1 | WAFER W1 | CX5 | CY5 | P1 | PRE-PROCESS | TEST BA | FORMAL | 203 |
| PRODUCT A | LOT L1 | WAFER W1 | CX5 | CY6 | P0 | PRE-PROCESS | TEST BA | FORMAL | 20 |
| PRODUCT A | LOT L1 | WAFER W1 | CX5 | ⋮ | ⋮ | ⋮ | ⋮ | ⋮ | ⋮ |
| PRODUCT A | LOT L1 | WAFER W1 | CX5 | CY5 | P0 | PRE-PROCESS | TEST BB | MONITOR | 27 |
| PRODUCT A | LOT L1 | WAFER W1 | CX5 | ⋮ | ⋮ | ⋮ | ⋮ | ⋮ | ⋮ |
| PRODUCT A | LOT L1 | WAFER W1 | CX5 | CY5 | P0 | POST-PROCESS | TEST ba | FORMAL | 101 |
| PRODUCT A | LOT L1 | WAFER W1 | CX5 | CY5 | P0 | POST-PROCESS | TEST ba | FORMAL | 103 |
| PRODUCT A | LOT L1 | WAFER W1 | CX5 | CY5 | P0 | POST-PROCESS | TEST ba | FORMAL | 105 |
| PRODUCT A | LOT L1 | WAFER W1 | CX5 | CY5 | P1 | POST-PROCESS | TEST ba | FORMAL | 200 |
| PRODUCT A | LOT L1 | WAFER W1 | ⋮ | ⋮ | ⋮ | ⋮ | ⋮ | ⋮ | ⋮ |
| PRODUCT B | ⋮ | ⋮ | ⋮ | ⋮ | ⋮ | ⋮ | ⋮ | ⋮ | ⋮ |

FIG. 7C

| PRODUCT | LOT | WAFER | CHIP X | CHIP Y | PLANE | PROCESS STEPS | TEST | TEST CLASSIFICATION | FAIL COLUMN LOGICAL ADDRESS |
|---|---|---|---|---|---|---|---|---|---|
| PRODUCT A | LOT L1 | WAFER W1 | CX5 | CY5 | P0 | PRE-PROCESS | TEST CA | FORMAL | 0 |
| PRODUCT A | LOT L1 | WAFER W1 | CX5 | CY5 | P0 | PRE-PROCESS | TEST CA | FORMAL | 1 |
| PRODUCT A | LOT L1 | WAFER W1 | CX5 | CY5 | P0 | PRE-PROCESS | TEST CA | FORMAL | 104 |
| PRODUCT A | LOT L1 | WAFER W1 | CX5 | CY5 | P0 | PRE-PROCESS | TEST CA | FORMAL | 201 |
| PRODUCT A | LOT L1 | WAFER W1 | CX5 | CY6 | P1 | PRE-PROCESS | TEST CA | FORMAL | 203 |
| PRODUCT A | LOT L1 | WAFER W1 | CX5 | CY6 | P1 | PRE-PROCESS | TEST CA | FORMAL | 102 |
| PRODUCT A | LOT L1 | WAFER W1 | ⋮ | ⋮ | ⋮ | ⋮ | ⋮ | ⋮ | ⋮ |
| PRODUCT A | LOT L1 | WAFER W1 | CX5 | CY5 | P0 | POST-PROCESS | TEST ca | FORMAL | 2 |
| PRODUCT A | LOT L1 | WAFER W1 | CX5 | CY5 | P0 | POST-PROCESS | TEST ca | FORMAL | 3 |
| PRODUCT A | LOT L1 | WAFER W1 | CX5 | CY5 | P0 | POST-PROCESS | TEST cb | FORMAL | 102 |
| PRODUCT A | LOT L1 | WAFER W1 | CX5 | CY5 | P1 | POST-PROCESS | TEST cb | MONITOR | 202 |
| PRODUCT A | LOT L1 | WAFER W1 | CX5 | CY6 | ⋮ | POST-PROCESS | TEST cb | MONITOR | 204 |
| PRODUCT A | LOT L1 | WAFER W1 | ⋮ | ⋮ | ⋮ | ⋮ | ⋮ | MONITOR | 100 |
| PRODUCT A | LOT L1 | ⋮ | ⋮ | ⋮ | ⋮ | ⋮ | ⋮ | ⋮ | ⋮ |
| PRODUCT B | ⋮ | ⋮ | ⋮ | ⋮ | ⋮ | ⋮ | ⋮ | ⋮ | ⋮ |
| ⋮ | | | | | | | | | |

FIG. 9

| PLANE P0 | PLANE P1 |
|---|---|
| Pb0 (Vb 402) | Pb0 (Vb 403) |
| Pb1 (Vb 400) | Pb1 (Vb 401) |
| Pb2 (Vb 398) | Pb2 (Vb 399) |
| Pb3 (Vb 396) | Pb3 (Vb 397) |
| Pb4 (Vb 394) | Pb4 (Vb 395) |
| Pb5 (Vb 392) | Pb5 (Vb 393) |
| ⋮ | ⋮ |
| Pb199 (Vb 4) | Pb199 (Vb 5) |
| Pb200 (Vb 2) | Pb200 (Vb 3) |
| Pb201 (Vb 0) | Pb201 (Vb 1) |
| ⋮ | ⋮ |
| Pb999 (Vb 404) | Pb999 (Vb 405) |

FIG. 10

| PRODUCT | PLANE | LOGICAL BLOCK ADDRESS | PHYSICAL BLOCK ADDRESS |
|---|---|---|---|
| PRODUCT A | P0 | Vb0 | Pb201 |
| PRODUCT A | P1 | Vb1 | Pb201 |
| PRODUCT A | P0 | Vb2 | Pb200 |
| PRODUCT A | P1 | Vb3 | Pb200 |
| PRODUCT A | P0 | Vb4 | Pb199 |
| PRODUCT A | P1 | Vb5 | Pb199 |
| PRODUCT A | ... | ... | ... |

FIG. 11

PLANE P0

| Pc0 | Pc1 | Pc2 | Pc3 | Pc4 | Pc5 | Pc6 | Pc7 | ... | Pc96 | Pc97 | Pc98 | Pc99 |
| Vc0 | Vc50 | Vc1 | Vc51 | Vc2 | Vc52 | Vc3 | Vc53 | | Vc48 | Vc98 | Vc49 | Vc99 |

PLANE P1

| Pc0 | Pc1 | Pc2 | Pc3 | Pc4 | Pc5 | Pc6 | Pc7 | ... | Pc96 | Pc97 | Pc98 | Pc99 |
| Vc0 | Vc50 | Vc1 | Vc51 | Vc2 | Vc52 | Vc3 | Vc53 | | Vc48 | Vc98 | Vc49 | Vc99 |

FIG. 12

| PRODUCT | PLANE | LOGICAL COLUMN ADDRESS | PHYSICAL COLUMN ADDRESS |
|---|---|---|---|
| PRODUCT A | P0 | Vc0 | Pc0 |
| PRODUCT A | P0 | Vc1 | Pc2 |
| PRODUCT A | P0 | Vc2 | Pc4 |
| PRODUCT A | P0 | Vc3 | Pc6 |
| PRODUCT A | P0 | Vc4 | Pc8 |
| PRODUCT A | P0 | Vc5 | Pc10 |
| PRODUCT A | P0 | ... | ... |
| PRODUCT A | P1 | Vc0 | Pc0 |
| PRODUCT A | P1 | Vc1 | Pc2 |
| PRODUCT A | P1 | Vc2 | Pc4 |
| PRODUCT A | P1 | Vc3 | Pc6 |
| PRODUCT A | P1 | Vc4 | Pc8 |
| PRODUCT A | P1 | Vc5 | Pc10 |
| PRODUCT A | P1 | ... | ... |

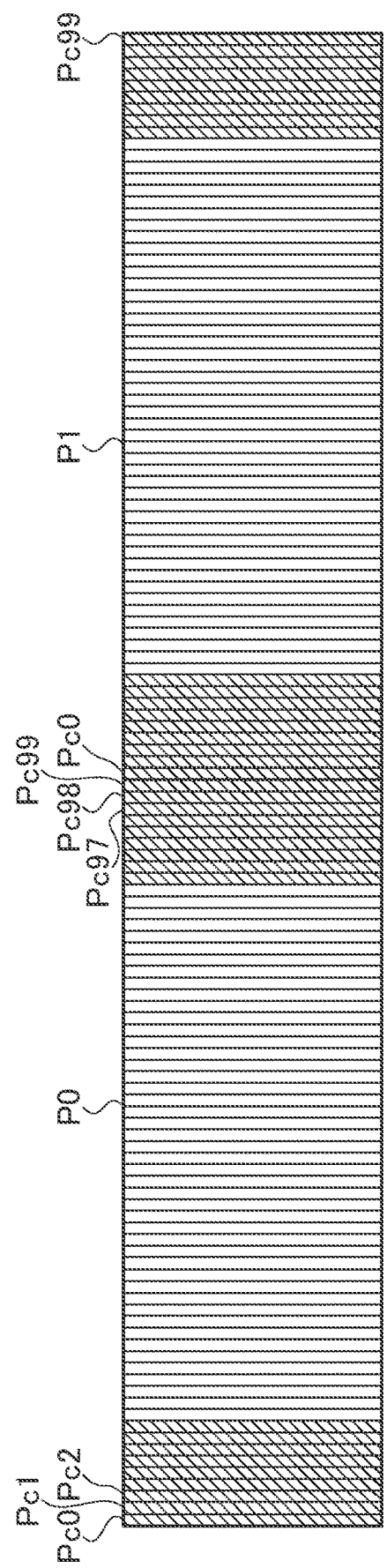

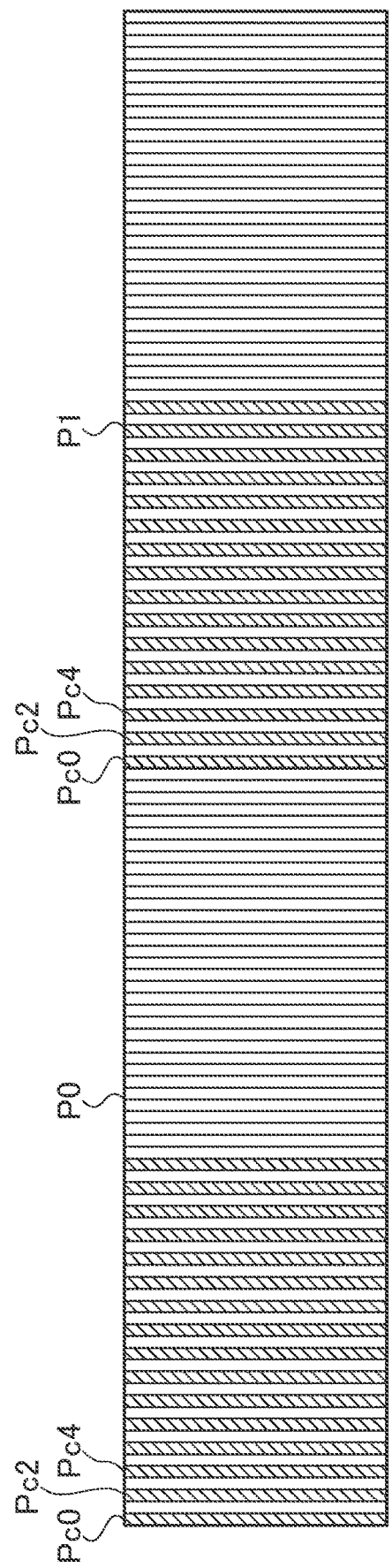

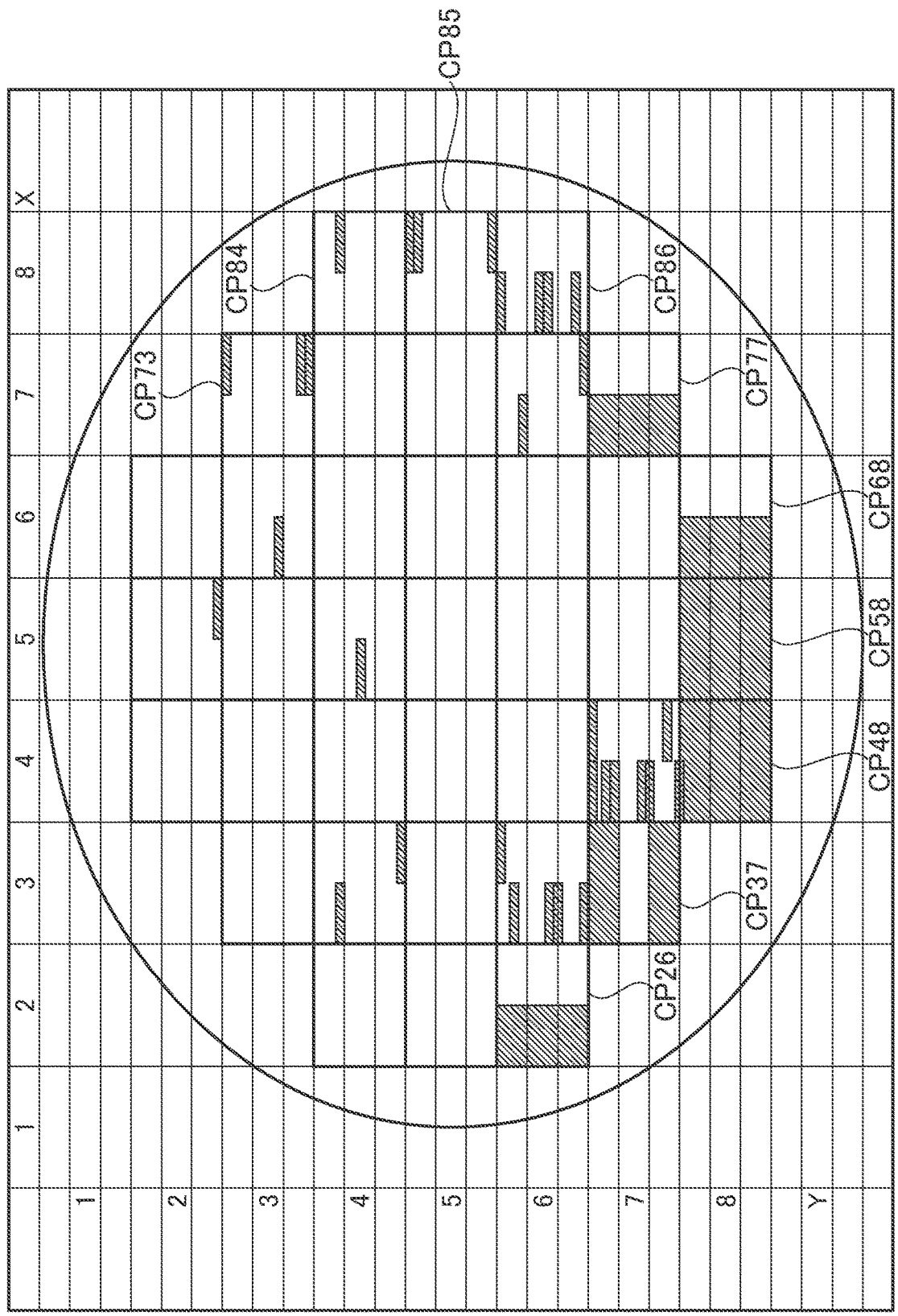

FIG. 17

| PRODUCT | LOT | WAFER | CHIP X | CHIP Y | PLANE | PROCESS STEPS | BLOCK/ COLUMN | TEST | INSPECTION APPARATUS CONFIGURED BY CHANGING TESTER | STARTING DATE AND TIME OF INSPECTION | THE NUMBER OF FAILURES |
|---|---|---|---|---|---|---|---|---|---|---|---|
| PRODUCT A | LOT L1 | WAFER W1 | CX5 | CY5 | P0 | PRE-PROCESS | blk | TEST BA | TESTER TS1 | 2019.9.1 10:00:01 | 4 |
| PRODUCT A | LOT L1 | WAFER W1 | CX5 | CY5 | P1 | PRE-PROCESS | blk | TEST BA | TESTER TS1 | 2019.9.1 10:00:01 | 1 |
| PRODUCT A | LOT L1 | WAFER W1 | CX5 | CY6 | P0 | PRE-PROCESS | blk | TEST BA | TESTER TS1 | 2019.9.1 10:00:01 | 16 |
| PRODUCT A | LOT L1 | WAFER W1 | CX5 | CY6 | P1 | PRE-PROCESS | blk | TEST BA | TESTER TS1 | 2019.9.1 10:00:01 | 250 |
| PRODUCT A | LOT L1 | WAFER W1 | CX5 | CY7 | P0 | PRE-PROCESS | blk | TEST BA | TESTER TS1 | 2019.9.1 10:00:01 | 1 |
| PRODUCT A | LOT L1 | WAFER W1 | ... | ... | ... | PRE-PROCESS | blk | TEST BA | TESTER TS1 | 2019.9.1 10:00:01 | ... |
| PRODUCT A | LOT L1 | WAFER W1 | CX5 | CY5 | P0 | PRE-PROCESS | blk | TEST BB | TESTER TS1 | 2019.9.1 10:04:10 | 821 |
| PRODUCT A | LOT L1 | WAFER W1 | ... | ... | ... | PRE-PROCESS | col | TEST CA | TESTER TS2 | 2019.9.1 10:17:02 | ... |
| PRODUCT A | LOT L1 | WAFER W1 | ... | ... | ... | ... | ... | ... | ... | ... | ... |
| PRODUCT A | LOT L1 | WAFER W1 | CX5 | CY5 | P0 | POST-PROCESS | blk | TEST ba | TESTER TS10 | 2019.9.5 04:00:04 | 566 |
| PRODUCT A | LOT L1 | WAFER W1 | CX5 | CY5 | P1 | POST-PROCESS | blk | TEST ba | TESTER TS10 | 2019.9.5 04:01:00 | 560 |
| PRODUCT A | LOT L1 | WAFER W1 | CX5 | CY6 | P0 | POST-PROCESS | blk | TEST ba | TESTER TS10 | 2019.9.5 04:01:00 | 10 |
| PRODUCT A | LOT L1 | WAFER W1 | CX5 | CY6 | P1 | POST-PROCESS | blk | TEST ba | TESTER TS10 | 2019.9.5 04:01:00 | 12 |
| PRODUCT A | LOT L1 | WAFER W1 | CX5 | CY7 | P0 | POST-PROCESS | blk | TEST ba | TESTER TS10 | 2019.9.5 04:01:00 | 8 |
| PRODUCT A | LOT L1 | WAFER W1 | ... | ... | ... | POST-PROCESS | blk | TEST ba | TESTER TS10 | 2019.9.5 04:01:00 | ... |
| PRODUCT A | LOT L1 | WAFER W1 | CX5 | CY5 | P0 | POST-PROCESS | blk | TEST bb | TESTER TS10 | 2019.9.5 04:01:00 | 108 |
| PRODUCT A | LOT L1 | WAFER W1 | ... | ... | ... | POST-PROCESS | col | TEST ca | TESTER TS10 | 2019.9.5 04:01:00 | ... |
| PRODUCT A | LOT L1 | WAFER W1 | ... | ... | ... | ... | ... | ... | ... | ... | ... |
| PRODUCT B | ... | ... | ... | ... | ... | ... | ... | ... | ... | ... | ... |

FIG. 18

| PRODUCT | LOT | WAFER | CHIP X | CHIP Y | PLANE | PROCESS STEPS | BLOCK/COLUMN | TEST | PROCESS CONDITIONS | FABRICATING APPARATUS | FABRICATING DATE AND TIME | STARTING DATE AND TIME OF INSPECTION | THE NUMBER OF FAILURES |
|---|---|---|---|---|---|---|---|---|---|---|---|---|---|
| PRODUCT A | LOT L1 | WAFER W1 | CX5 | CY5 | P0 | PRE-PROCESS | blk | TEST BA | K | APPARATUS S1 | 2019.8.9 8:20:02 | 2019.9.1 10:00:01 | 4 |
| PRODUCT A | LOT L1 | WAFER W1 | CX5 | CY5 | P1 | PRE-PROCESS | blk | TEST BA | K | APPARATUS S1 | 2019.8.9 8:20:02 | 2019.9.1 10:00:01 | 1 |
| PRODUCT A | LOT L1 | WAFER W1 | CX5 | CY6 | P0 | PRE-PROCESS | blk | TEST BA | k | APPARATUS S1 | 2019.8.9 8:20:02 | 2019.9.1 10:00:01 | 16 |
| PRODUCT A | LOT L1 | WAFER W1 | CX5 | CY6 | P1 | PRE-PROCESS | blk | TEST BA | k | APPARATUS S1 | 2019.8.9 8:20:02 | 2019.9.1 10:00:01 | 250 |
| PRODUCT A | LOT L1 | WAFER W1 | CX5 | CY7 | P0 | PRE-PROCESS | blk | TEST BA | k | APPARATUS S1 | 2019.8.9 8:20:02 | 2019.9.1 10:00:01 | 1 |
| PRODUCT A | LOT L1 | WAFER W1 | ... | ... | ... | PRE-PROCESS | blk | TEST BA | m | APPARATUS S1 | 2019.8.9 8:20:02 | 2019.9.1 10:00:01 | ... |
| PRODUCT A | LOT L1 | WAFER W1 | CX5 | CY5 | P0 | PRE-PROCESS | blk | TEST BB | m | APPARATUS S1 | 2019.8.9 8:20:02 | 2019.9.1 10:04:10 | 821 |
| PRODUCT A | LOT L1 | WAFER W1 | ... | ... | ... | PRE-PROCESS | col | TEST CA | k | APPARATUS S1 | 2019.8.9 8:20:02 | 2019.9.1 10:17:02 | ... |
| PRODUCT A | LOT L1 | WAFER W1 | ... | ... | ... | ... | ... | ... | ... | ... | ... | ... | ... |
| PRODUCT A | LOT L1 | WAFER W1 | CX5 | CY5 | P0 | POST-PROCESS | blk | TEST ba | k | APPARATUS S1 | 2019.8.9 8:20:02 | 2019.9.5 04:00:04 | 566 |
| PRODUCT A | LOT L1 | WAFER W1 | CX5 | CY5 | P1 | POST-PROCESS | blk | TEST bb | k | APPARATUS S1 | 2019.8.9 8:20:02 | 2019.9.5 04:01:00 | 560 |
| PRODUCT A | LOT L1 | WAFER W1 | CX5 | CY6 | P0 | POST-PROCESS | blk | TEST ca | k | APPARATUS S1 | 2019.8.9 8:20:02 | 2019.9.5 04:01:00 | 10 |
| PRODUCT A | LOT L1 | WAFER W1 | CX5 | CY6 | P1 | | | | | | | | |
| PRODUCT A | LOT L1 | WAFER W1 | CX5 | CY7 | P0 | | | | | | | | |

FAILURE ANALYSIS SYSTEM OF SEMICONDUCTOR DEVICE, FAILURE ANALYSIS METHOD OF SEMICONDUCTOR DEVICE, AND NON-TRANSITORY COMPUTER READABLE MEDIUM

CROSS REFERENCE TO RELATED APPLICATIONS

This application is based upon and claims the benefit of priority from prior Japanese Patent Application No. P2020-143635 filed on Aug. 27, 2020, the entire contents of which are incorporated herein by reference.

FIELD

Embodiments described herein relate generally to a failure analysis system of a semiconductor device, a failure analysis method of the semiconductor device, and a non-transitory computer readable medium.

BACKGROUND

For semiconductor memories, electrical evaluation in a wafer unit is performed using a tester in a pre-process of fabrication, and electrical evaluation in a chip unit is performed using the tester after dividing the wafer into a plurality of chips in a post-process. On the basis of an evaluation result in the wafer unit in the pre-process and an evaluation result of the chip unit in the post-process, a wafer failure distribution is generated by assigning failure information in the chip unit at a chip location in a wafer surface.

NAND flash memories include an extra block (s) and an extra column(s) in addition to normal blocks and normal columns, and when a failure occurs in the normal block and/or the normal column, the extra block and/or the extra column is allocated as an alternative.

BRIEF DESCRIPTION OF THE DRAWINGS

FIG. 1 is a configuration diagram of a failure analysis system of a semiconductor device according to embodiments.

FIG. 4 is a diagram illustrating an example of an inspection in a pre-process of semiconductor fabrication in the failure analysis system of the semiconductor device according to embodiments.

FIG. 6 is a diagram illustrating an example of a tester collection information file in a block unit and a column unit collected by a tester in the failure analysis system of the semiconductor device according to embodiments.

FIG. 7A is a diagram illustrating an example of a summary table in the failure information management table in the block unit and the column unit collected by the tester in the failure analysis system of the semiconductor device according to embodiments.

FIG. 7B is a diagram illustrating an example of a block table in the failure analysis system of the semiconductor device according to embodiments.

FIG. 7C is a diagram illustrating an example of a column table in the failure analysis system of the semiconductor device according to embodiments.

FIG. 9 is a diagram illustrating an example of a block layout in a chip of the failure analysis system of the semiconductor device according to embodiments.

FIG. 10 is a diagram illustrating an example of a block logical-to-physical address conversion table created by corresponding a logical block address to a physical block address for each product and each plane in the failure analysis system of the semiconductor device according to embodiments.

FIG. 11 is a diagram illustrating an example of a column layout in the chip of the failure analysis system of the semiconductor device according to embodiments.

FIG. 12 is a diagram illustrating an example of a column logical-to-physical address conversion table created by corresponding a logical column address to a physical column address for each product and each plane in the failure analysis system of the semiconductor device according to embodiments.

FIG. 14A is a diagram illustrating a column map of a failure in plane edge in the failure analysis system of the semiconductor device according to embodiments.

FIG. 14B is a diagram illustrating a column map of a failure every other column on the left side in the failure analysis system of the semiconductor device according to embodiments.

FIG. 16A is a diagram illustrating an example of a wafer map of fail blocks in a monitor test in a pre-process of fabrication, in the failure analysis system of the semiconductor device according to embodiments.

FIG. 17 is a diagram illustrating an example of a summary table including an inspection apparatus in the failure analysis system of the semiconductor device according to embodiments.

FIG. 18 is a diagram illustrating an example of a summary table including process conditions, a fabricating apparatus, and fabricating date information in the failure analysis system of the semiconductor device according to embodiments.

DETAILED DESCRIPTION

Hereinafter, there will be described a failure analysis system of a semiconductor device, a failure analysis method of the semiconductor device, and a failure analysis program of the semiconductor device according to embodiments in detail, with reference to the drawings.

The drawings referred to are merely schematic. In the following explanation, the common reference signs are attached to constituents having substantially the same functions and configurations.

Certain embodiments disclosed herein provide a failure analysis system of a semiconductor device, a failure analysis method of the semiconductor device, and a non-transitory computer readable medium, capable of integrative analysis ranging over a plurality of inspection processes with regard to normal/failure information in a block unit and a column unit, and improving analysis efficiency.

According to one embodiment, the failure analysis system of the semiconductor device comprises a memory, a failure information management table, and an analyzing unit. The memory stores normal/failure information collected in a block unit and a column unit in a chip in a plurality of inspection processes of the semiconductor memory. The failure information management table stores the normal/failure information in the block unit and the column unit stored in the memory, with an addition of product information, fabricating information including a lot number, a wafer number, and a chip address which are fabricating units, process information, and test information, which are common information ranging over the inspection processes. The analyzing unit analyzes the normal/failure information in the block unit and the column unit ranging over the plurality of inspection processes, on the basis of the information stored in the failure information management table.

Figure 2A:
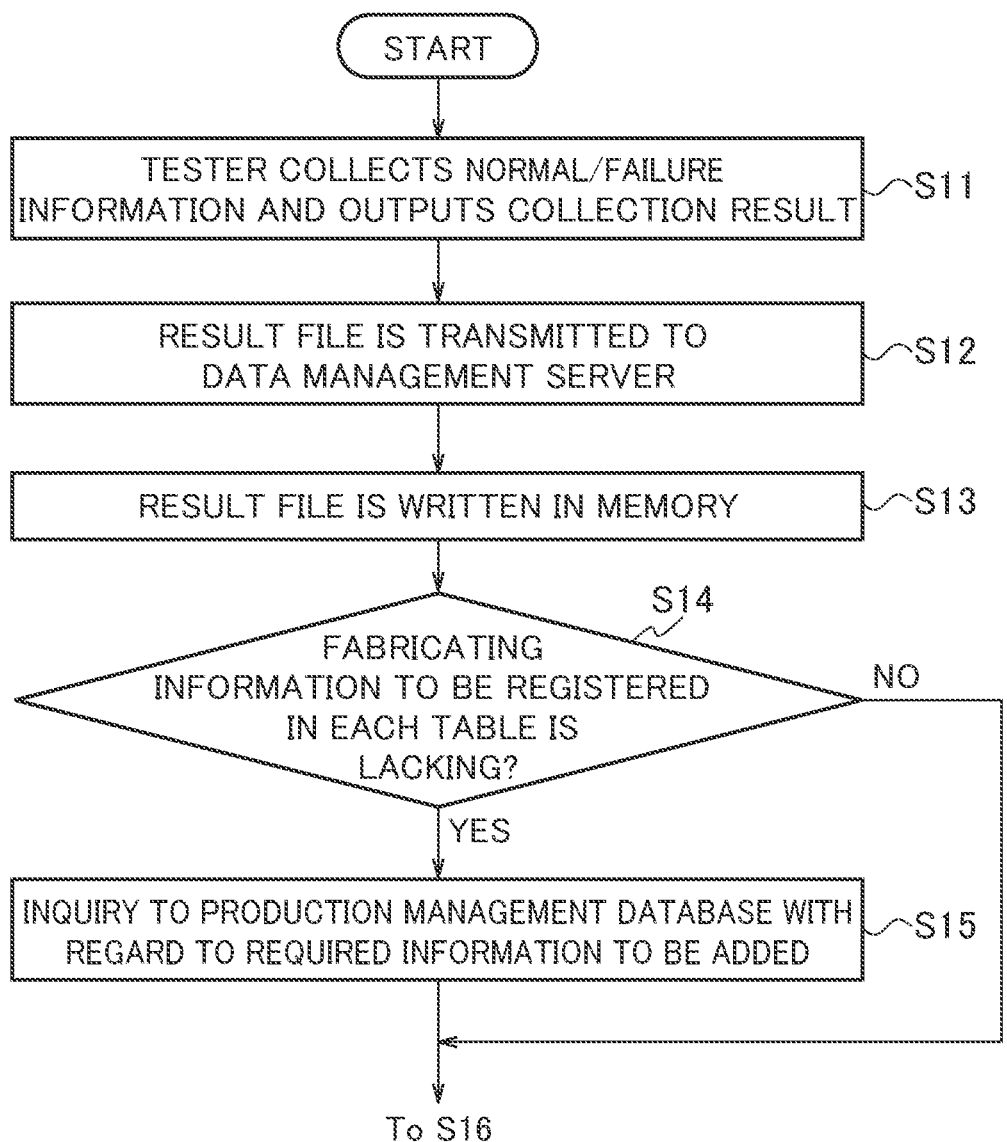
FIG. 2A is a flow chart (first half) of a failure analysis method of the semiconductor device according to embodiments.
Figure 2B:
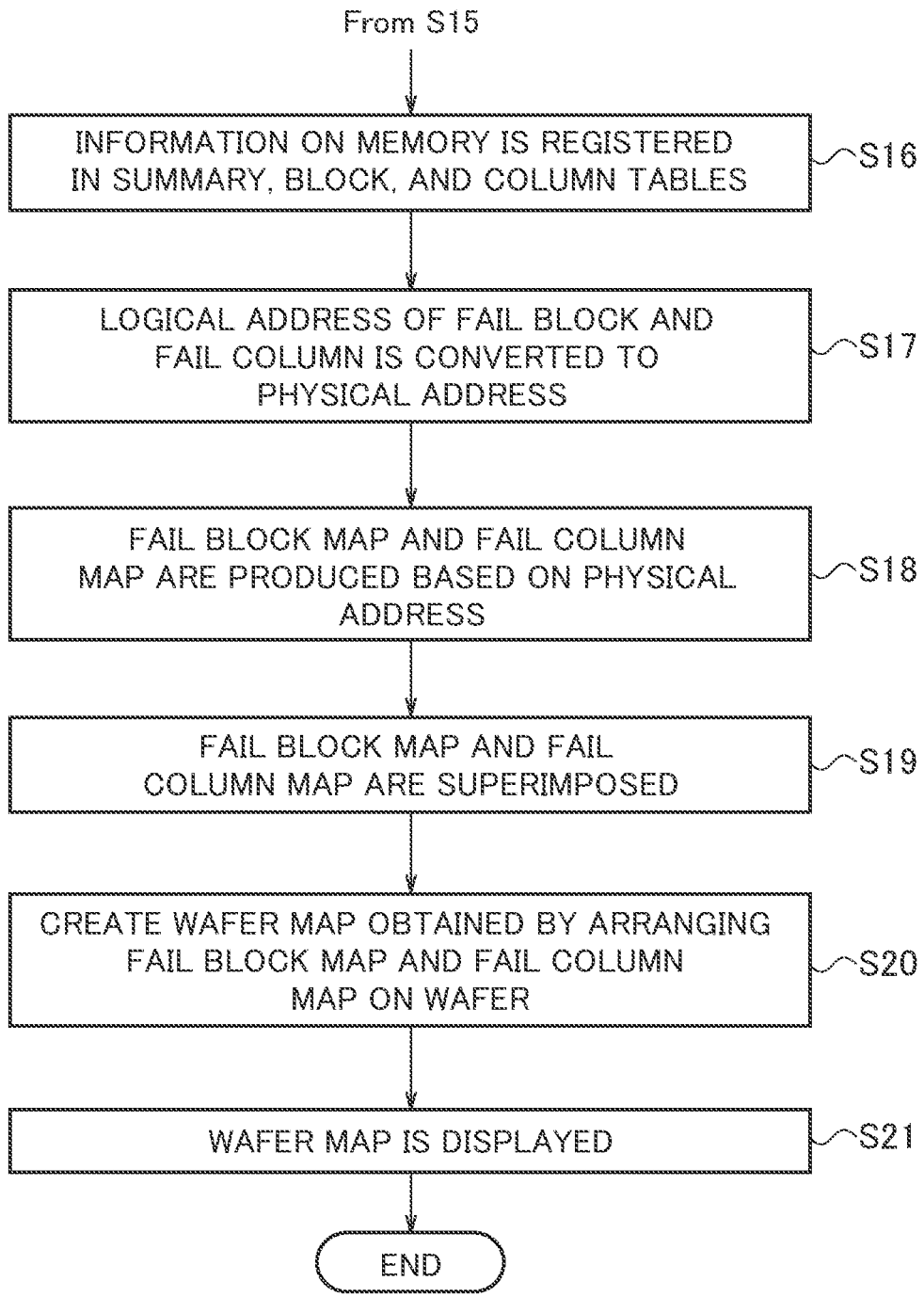
FIG. 2B is a flow chart (latter half) of the failure analysis method of the semiconductor device according to embodiments.

FIG. 1 is a configuration diagram of a failure analysis system of a semiconductor device according to embodiments. FIG. 2A is a flow chart (first half) of a failure analysis method of the semiconductor device according to embodiments. FIG. 2B is a flow chart (latter half) of the failure analysis method of the semiconductor device according to embodiments. The failure analysis system of a semiconductor device and the failure analysis method of the semiconductor device will now be described, with reference to FIGS. 1, 2A, and 2B.

The failure analysis system of the semiconductor device is configured to add product information; a fabricating information including a lot number, wafer number, and chip address as a fabricating unit; process information; and test information; which are common information ranging over a plurality of inspection processes, to normal/failure information collected in a block unit and column unit in a chip in a plurality of inspection processes of semiconductor memory. The plurality of inspection processes includes an inspection process in a pre-process of fabrication of semiconductor products, an inspection process of a post-process thereof, and a final inspection process before shipment of the semiconductor products.

The failure analysis system of the semiconductor device is configured to analyze normal/failure information in a block unit and a column unit ranging over a plurality of inspection processes, on the basis of the normal/failure information, the product information, the fabricating information, the process information, and the test information in the block unit and the column unit.

(Wafer Map of Semiconductor Memory)

Figure 3A:
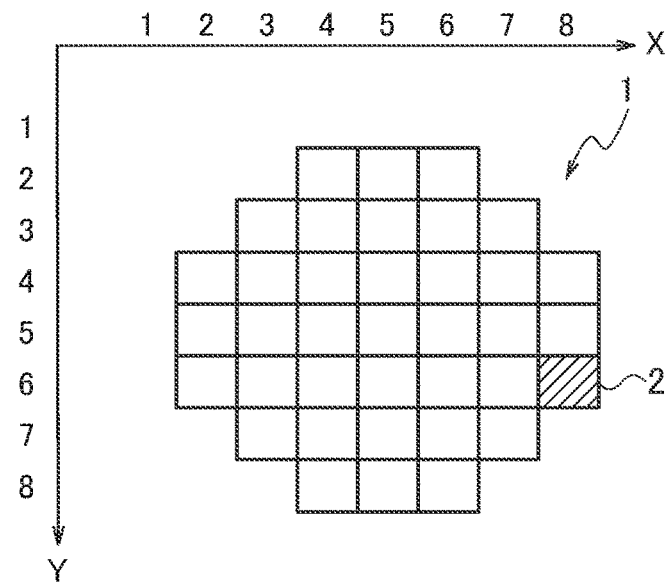
FIG. 3A is a diagram illustrating an example of a wafer map of a semiconductor memory in the failure analysis system of the semiconductor device according to embodiments.

FIG. 3A is a diagram illustrating an example of a wafer map of a semiconductor memory, in the failure analysis system of the semiconductor device according to embodiments. The semiconductor memory is, for example, a NAND flash memory, but may be any other memory as long as the memory has a block and a column to be set to a chip of the memory. A chip 2 arranged on a wafer 1 is managed by setting coordinate (chip address) thereof in a lateral (X) direction and a longitudinal (Y) direction.

(Chip Configuration)

Figure 3B:
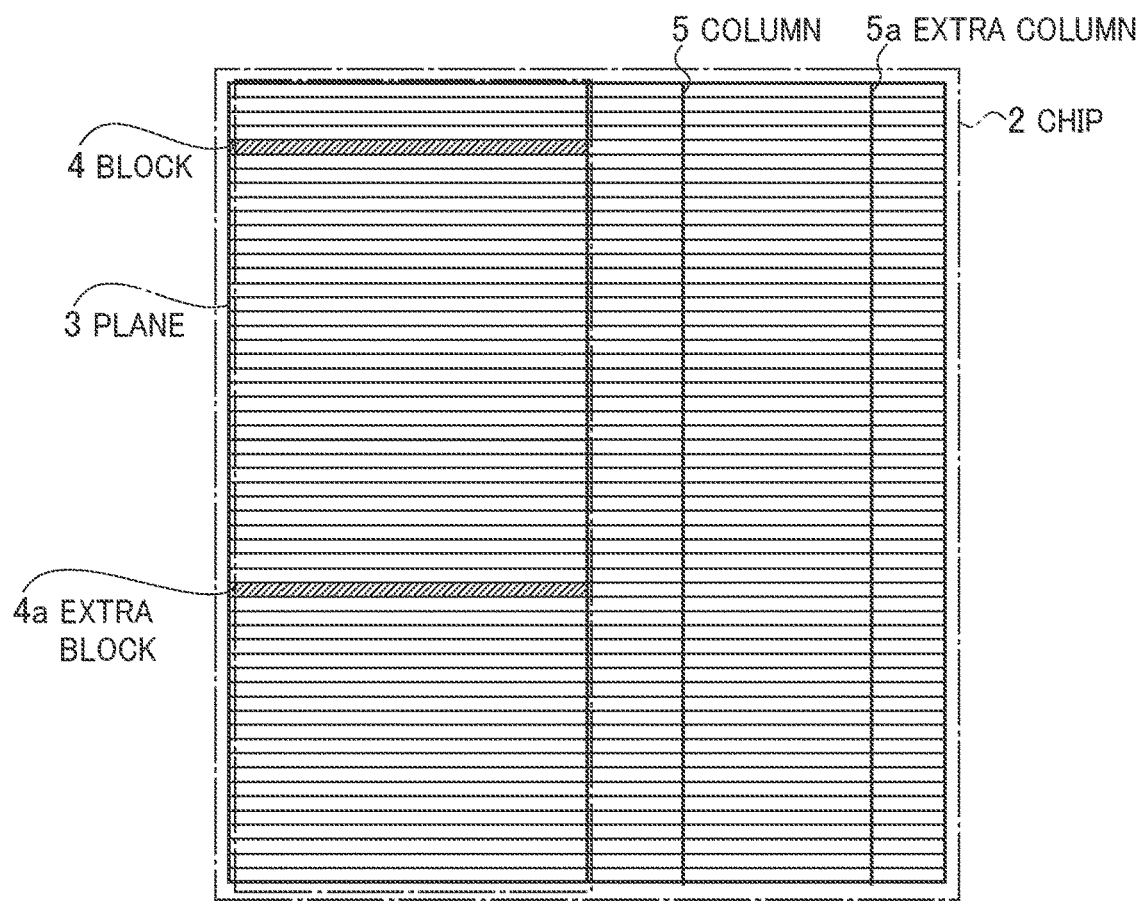
FIG. 3B is a diagram illustrating an example of a chip configuration of the semiconductor memory in the failure analysis system of the semiconductor device according to embodiments.

FIG. 3B shows an example of a configuration of the chip of the semiconductor memory, in the failure analysis system of the semiconductor device according to embodiments. A framework of an outermost periphery thereof illustrates the chip 2, and a large division for dividing the chip 2 is a plane 3. The chip 2 is configured to include two planes 3, in this example. A small division arranged in the lateral direction of the plane 3 is a block 4.

Moreover, columns 5 are arranged in a vertical direction of the plane 3. On the chip 2, in addition to the normal block 4 and the normal column 5, an extra block 4a and an extra column 5b for being allocated as an alternative when a failure occurs in the normal block 4 and/or the normal column 5 are provided.

In FIG. 3B, a small area arranged in the lateral direction of the plane 3 is an example of the extra block 4a, and an area in the vertical direction of the plane 3 is an example of the extra column 5a. The extra block 4a and the extra column 5a are arranged side by side in the same way as the normal block 4 and the normal column 5, and are manage and inspected by allocating addresses in the same way as the normal block 4 and the normal column 5. When a failure occurs in the normal block 4 and/or the normal column 5, a proper extra block 4a and/or a proper extra column 5a are allocated as an alternative, and thereby the failure thereof is salvaged in the block unit and the column unit.

(Configuration of Failure Analysis System of Semiconductor Device)

The failure analysis system of the semiconductor device includes a data management server 10 connected to a tester collection information file 8 storing information collected by a tester 7, a semiconductor failure analysis user interface 32, and a user personal computer (PC) 31, as illustrated in FIG. 1.

The user PC 31 provides an instruction to the data management server 10 via the semiconductor failure analysis user interface 32 to conduct a failure analysis of the semiconductor device. The semiconductor failure analysis user interface 32 manages communication between the user PC 31 and the data management server 10.

The data management server 10 analyzes normal/failure information in the block unit and the column unit ranging over a plurality of inspection processes, using the normal/failure information, the product information, the fabricating information, the process information, and the test information in the block unit and the column unit obtained from the tester collection information file 8.

(Configuration of Data Management Server 10)

The data management server 10 includes a tester output information receiving unit 12, a tester output information memory 13, a normal/failure information reading unit 14, a memory configuration information 15, an information adding unit 16, a production management database 17, an information registration/analysis unit 18, a failure information management table 19, a logical-to-physical address conversion table 20, a logical-to-physical address conversion unit 21, a map information creation unit 22, a map information unit 23, and an information display unit 24.

Moreover, the data management server 10 includes a Read Only Memory (ROM) 25 and a control unit 26. The ROM 25 is a data read-only memory. The ROM 25 stores a failure analysis program (corresponding to a computer program). The ROM 25 may be, for example, a non-transitory computer-readable recording medium for storing a computer program for analyzing a normal/failure of the semiconductor memory. The control unit 26 executes each process described in the flow chart illustrated in FIG. 2 by executing the failure analysis program stored in the ROM 25.

(Configuration of Tester 7)

A tester 7 performs various tests in an inspection in pre-process of semiconductor fabrication, an inspection in post-process thereof, and an inspection in final process thereof. In each in-process inspection, a plurality of contents of the test and an order of executing the tests are defined as a test program. Then, the test program is operated to perform a series of tests. The tester 7 performs a test to determine normal/failure for each block or a test to determine normal/failure for each column.

FIG. 4 is a diagram illustrating an example of an inspection in a pre-process of semiconductor fabrication in the failure analysis system of the semiconductor device according to embodiments. A test name is configured to include 16 of power source tests PT1, PT2, data transfer tests DT1, DT2, leakage tests LT1 to LT6, open tests OT1, OT2, erasing tests ET1, ET2, and program tests PRT1, PRT2.

A test type includes a column test for determining normal/failure for each column, and a block test for determining normal/failure for each block. Moreover, there is a test classification including a regular test and a monitor test, in addition to the test type. The regular test is a test for determining normal/failure during the fabricating process. The monitor test is a test in which conditions are accelerated in order to grasp a true capability of the memory.

Figure 5A:
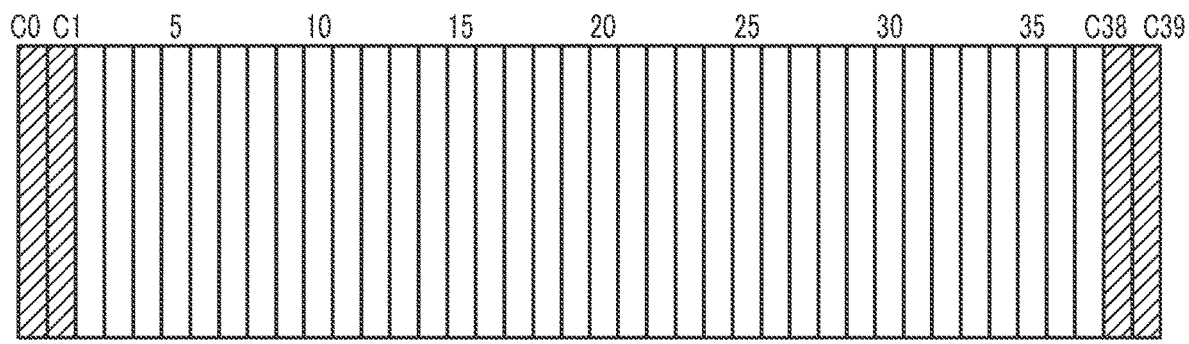
FIG. 5A is a diagram illustrating a fail column address with respect to a power source test PT1 in the failure analysis system of the semiconductor device according to embodiments.
Figure 5B:
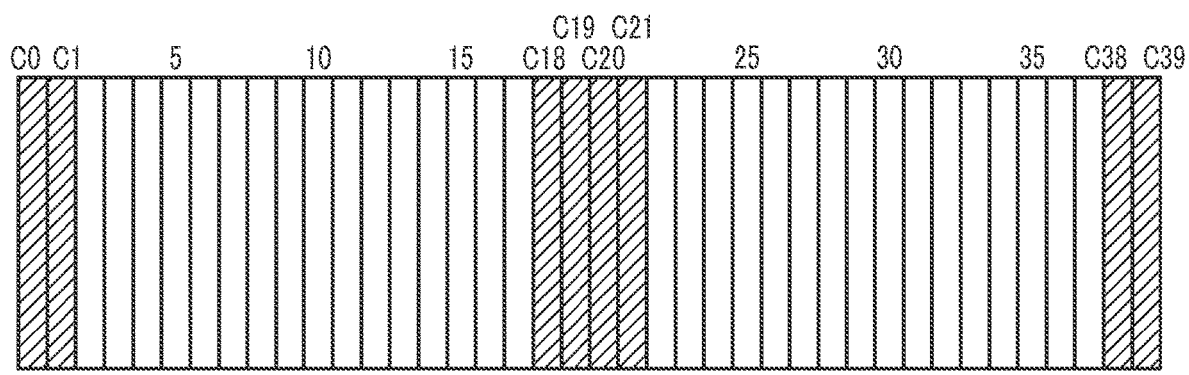
FIG. 5B is a diagram illustrating all fail column addresses after a power source test PT2 in the failure analysis system of the semiconductor device according to embodiments.
Figure 5C:
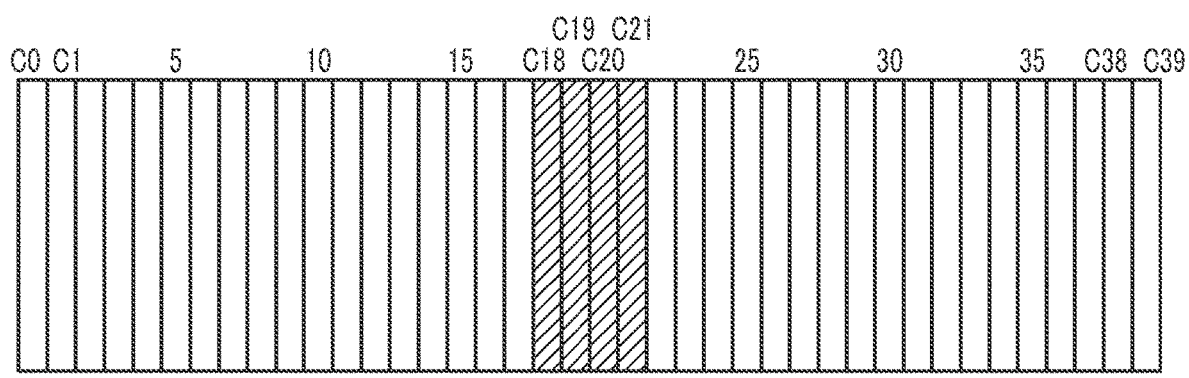
FIG. 5C is a diagram illustrating a fail column address with respect to the power source test PT2, in the failure analysis system of the semiconductor device according to embodiments.

FIGS. 5A to 5C illustrate an example of a calculating method of a fail address for each test of the failure analysis system of the semiconductor device according to embodiments. FIG. 5A illustrates a map indicating an occurrence status of a column failure in a power source test PT1 of order 1 of a certain chip, and addresses thereof. The numbers at an upper portion of the map indicate column addresses, and columns C0, C1, C38, and C39 at both ends of the chip are failure, in the power source test PT1.

FIG. 5B illustrates a map indicating all columns that are failure after a power source test PT2 of order 2 of the same chip, and addresses thereof. Four columns C18, C19, C20, and C21 at a center of the chip are failure, in addition to the four columns C0, C1, C38, and C39 at both ends of the chip in the power source test PT1.

FIG. 5C shows a map indicating an occurrence status of a column failure in the power source test PT2, and addresses thereof. The addresses obtained by removing the column fail address in the power source test PT1 illustrated in FIG. 5A which is immediately previous test from the all fail column addresses which are failure after the power source test PT2 illustrated in FIG. 5B are column addresses which are failure during the power source test PT2 illustrated in FIG. 5B. The four columns C18, C19, C20, and C21 at the center of the chip can be identified as newly fail columns In this way, the tester 7 outputs all the addresses of fail blocks or fail columns, and identifies the block or column which are failure during the test by taking the difference from the fail address information in the immediately previous test. The tester 7 collects normal/failure information of the block and normal/failure information of the column ranging over a plurality of inspection processes including an inspection in pre-process of semiconductor fabrication, an inspection in post-process of semiconductor fabrication, and an inspection in final process before shipment, and outputs the collected failure information to the tester collection information file 8 (Step S11).

In addition to a series of the regular tests for determining the normal/failure in the fabricating process, the tester 7 may collect the normal/failure information for reference by inserting a monitor test in which conditions are accelerated into the series of the regular tests, in order to grasp the true capability of the memory.

The tester collection information file 8 stores the failure information in the block unit or the column unit ranging over the plurality of inspection processes collected by the tester 7, and transmits the stored information to the data management server 10 (Step S12).

(Configuration of Tester Collection Information File 8)

FIG. 6 is a diagram illustrating an example of the tester collection information file 8 in the block unit and the column unit ranging over the plurality of inspection processes, collected by a tester in the failure analysis system of the semiconductor device according to embodiments. The tester collection information file 8 is provided in a disk, and provides product name A, a lot number L1 and a wafer number W1 which are fabricating unit information, and an inspection process name on a head line, for example. The tester collection information file 8 can additionally provide an inspection apparatus name (tester name). The tester collection information file 8 provides test names BA, BB, and CA . . . and starting date and time of inspection; chip addresses (chip X, chip Y) and plane information P0, P1; and the number of failures and fail block addresses Bad or fail column addresses Cad, under the head line.

Test names BA, BB, and CA . . . vary to one of or a combination of an inspection point, a purpose, a data input terminal, a test command, command entering order (e.g., write→erase→read), waiting time between commands, conditions, such as temperature during test, applied voltage during test, and an acceleration stress, and a criterion for determining normal/failure.

The tester output information receiving unit 12 receives failure information in the block unit or the column unit ranging over the plurality of inspection processes stored in the tester collection information file 8. The tester output information memory 13 is, for example, a disk, and stores the normal/failure information collected in the block unit and the column unit ranging over the plurality of inspection processes received by the tester output information receiving unit 12 (Step S13).

The normal/failure information reading unit 14 reads the normal/failure information in the block and column units from the tester output information memory 13, and provides the normal/failure information in the block and column units to the information adding unit 16.

The information adding unit 16 adds product information, fabricating information including a lot number, a wafer number, and a chip address which are fabricating units, process information, and test information, which are common information ranging over the plurality of inspection processes as memory configuration information 15, to the normal/failure information collected in the block unit and the column unit in the chip.

Next, the information adding unit 16 determined whether the fabricating information to be registered in the failure information management table 19 is lacking (Step S14). When the fabricating information is lacking, the information adding unit 16 inquire the production management database 17 to add the fabricating information (Step S15).

An information registration/analysis unit 18 registers, in the failure information management table 19, the normal/failure information obtained by the information adding unit 16, and the product information, the fabricating information including the lot number, the wafer number, and the chip address as the fabricating unit, process information, and the test information used by the inspections which are common information ranging over the inspection processes in the block unit and the column unit (Step S16). The failure information management table 19 in the block and column units includes a summary table 19*a*, a block table 19*b*, and a column table 19*c*.

(Configuration of Failure Information Management Table 19)

The failure information management table 19 stores the normal/failure information in the block unit and the column unit, with the addition of the product information, the fabricating information including the lot number, the wafer number, and the chip address as the fabricating units, the process information, and the test information used by the inspection, which are common information ranging over the inspection processes.

(Configuration of Summary Table 19*a*)

FIG. 7A is a diagram illustrating an example of the summary table 19*a* in the failure information management table 19 in the block unit and the column unit collected by the tester 7, in the failure analysis system of the semiconductor device according to embodiments. The summary table 19*a* manages the information by setting a total of eleven items of the product name; and a lot number L1, a wafer number W1, a chip CX, a chip CY and planes P0, P1 which are fabricating unit information; inspection processes (pre-process, post-process); a test type (block/column) for distinguishing between block information blk or column information col; test names BA, BB . . . , and test classification (formal, monitor); and the number of failures in the above-described ten items.

The information registration/analysis unit 18 also registers information on a proper (pass) chip and plane without a fail block or fail column, in the summary table 19*a* as the number of failures being "0", and thereby manages the chip addresses, the number of chips, and Pass information to be inspected. If some of fabricating unit information is unknown at the time of the data registration such as the inspection in post-process of semiconductor fabrication, the information is registered to which the unknown information is add by inquiring with the production management database 17.

When the test type (block/column) of the summary table 19*a* is the block (blk), the block table 19*b* illustrated in FIG. 7B manages the fail block logical address. When the test type (block/column) of the summary table 19*a* is the column (col), the column table 19*c* illustrated in FIG. 7C manages the fail column logical address.

(Configuration of Block Table 19*b*)

FIG. 7B is a diagram illustrating an example of the block table 19*b* in the failure analysis system of the semiconductor device according to embodiments. The block table 19*b* manages a total of ten items of information, adding a fail block (logic) address to the nine items of the product name, the lot number L1, the wafer number W1, the chip CX, the chip CY, the planes P0, P1, the inspection processes (pre-process, post-process), the test name, the test classification (formal, monitor) similar to the summary table 19*a*. Using the block table 19*b*, the fail block address for items including the product name A, the lot number L1, the wafer number W1, the chip CX, the chip CY, the processing steps, and test are verified.

In the second line of the summary table 19*a* illustrated in FIG. 7A, "product A, lot L1, wafer W1, chip X=5, chip Y=5, plane=P0, pre-process, blk, test BA, BB . . . , the number of failures=4" is registered. Since the test type (block/column) is "block (blk)", the block table 19*b* manages the fail block address. Four pieces of address information corresponding to "the number of failures=4" is managed in the second to fifth lines illustrated in FIG. 7B.

(Configuration of Column Table 19*c*)

FIG. 7C is a diagram illustrating an example of the column table 19*c* in the failure analysis system of the semiconductor device according to embodiments. The column table 19*c* manages a total of ten items of information, adding a fail column (logic) address to the nine items of the product name, the lot number L1, the wafer number W1, the chip CX, the chip CY, the planes P0, P1, the inspection processes (pre-process, post-process), the test name, the test classification (formal, monitor) similar to the summary table 19*a*. Using the column table 19*c*, the fail column address for items including the product name, the lot number L1, the wafer number W1, the chip CX, the chip CY, the processing steps, and test are verified.

The information registration/analysis unit 18 corresponds to an analyzing unit of the present embodiments, uses the information stored in the summary table 19*a*, sums the number of failures for items including wafer number W1 of a certain lot number L1 of a certain product name A, inspection process, and test name, and analyzes which wafer number has larger number of failures and which process has larger number of failures.

Figure 8:
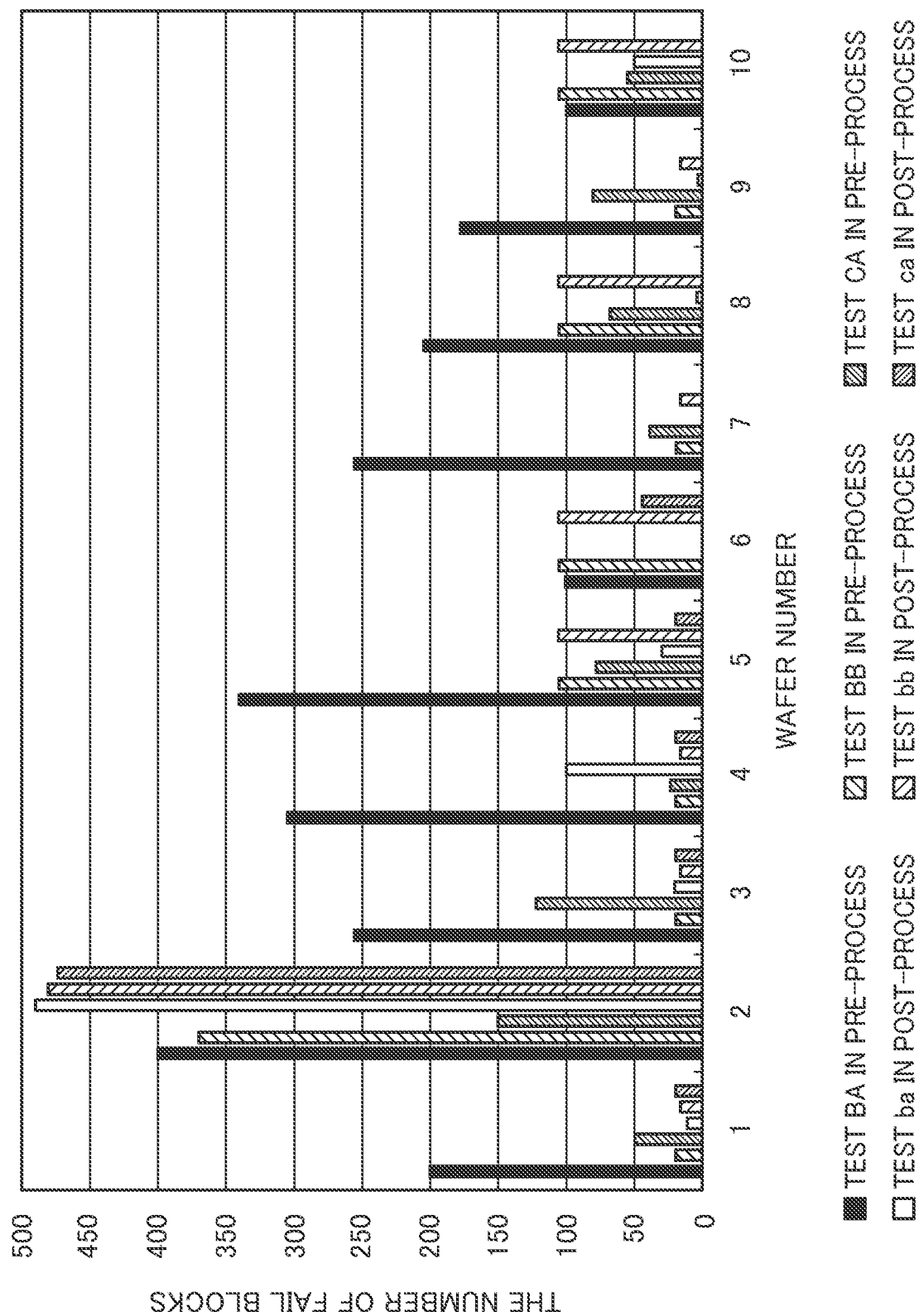
FIG. 8 is a diagram illustrating an example of a failure information summary graph in the failure analysis system of the semiconductor device according to embodiments.

FIG. 8 is a diagram illustrating an example of a failure information summary graph in the failure analysis system of the semiconductor device according to embodiments. The failure information summary graph is a graph obtained by summing the number of failures for items including wafer number W1 of a certain lot number L1 of a certain product name A, inspection process, and test name, with reference with the information stored in the summary table 19a, by the information registration/analysis unit 18. In the failure information summary graph, there is a tendency for the wafer number w2 to have a larger number of failures and the test BA to have a large number of failures.

Similarly, the information registration/analysis unit 18 is capable of various types of summaries, such as summing the number of failures for each start date of the inspection, and summing a failure rate for each test name. The information registration/analysis unit 18 can also sum and compare data of a plurality of inspection processes.

In this way, the failure analysis system can provide the failure summary information and failure distribution information in the block unit and the column unit ranging over a plurality of inspection processes, with reference to the summary table 19a. Accordingly, the failure analysis system can perform such an integrative analysis ranging over a plurality of inspection processes with regard to the normal/failure information in the block unit and the column unit.

Moreover, as illustrated in FIG. 1, the failure analysis system of the semiconductor device includes a logical-to-physical address conversion table 20, a logical-to-physical address conversion unit 21, a map information creation unit 22, a map information unit 23, and an information display unit 24.

(Configuration of Logical-to-Physical Address Conversion Table 20)

The logical-to-physical address conversion table 20 stores a corresponding relation between the logical block address and the physical block address. The logical-to-physical address conversion unit 21 converts the logical block address into the physical block address with reference to the logical-to-physical address conversion table 20.

FIG. 9 is a diagram illustrating an example of a block layout in a chip, in the failure analysis system of the semiconductor device according to embodiments. A plane P0 and a plane P1 are arranged at right and left in the chip, and physical block addresses Pb0 to Pb999 are arranged sequentially in each plane in order from the top. Logical block addresses Vb402 to Vb0 to Vb404 respectively corresponding to the physical block addresses Pb0 to Pb201 to Pb999 are described in parenthesis "( )".

FIG. 10 is a diagram illustrating an example of a logical-to-physical address conversion table created by corresponding the logical block addresses Vb0 to Vb5 . . . and the physical block addresses Pb201 to Pb199 . . . to each other, for each product A and each plane P0, P1, in the failure analysis system of the semiconductor device according to embodiments.

FIG. 11 is a diagram illustrating an example of a column layout in the chip, in the failure analysis system of the semiconductor device according to embodiments. A plane P0 and a plane P1 are arranged at right and left in the chip, physical column addresses Pc0 to Pc99 are arranged sequentially in order from the left in each plane P0, P1, and logical column addresses Vc0 to Vc99 respectively corresponding to the physical block addresses Pc0 to Pc99 are described in parenthesis "( )".

FIG. 12 is a diagram illustrating an example of a column logical-to-physical address conversion table created by corresponding a logical column address Vc0, Vc1, Vc2 to Vc5 . . . and a physical column address Pc0, Pc2, Pc4 to Pc10 . . . to each other for each product A and each plane P0, P1, in the failure analysis system of the semiconductor device according to embodiments.

The logical-to-physical address conversion unit 21 converts the logical block address stored in the block table 19b illustrated FIG. 7B into the physical block address, with reference to the logical-to-physical address conversion table 20 illustrated in FIG. 10 (Step S17).

(Display of Block Map and Column Map)

Figure 13A:
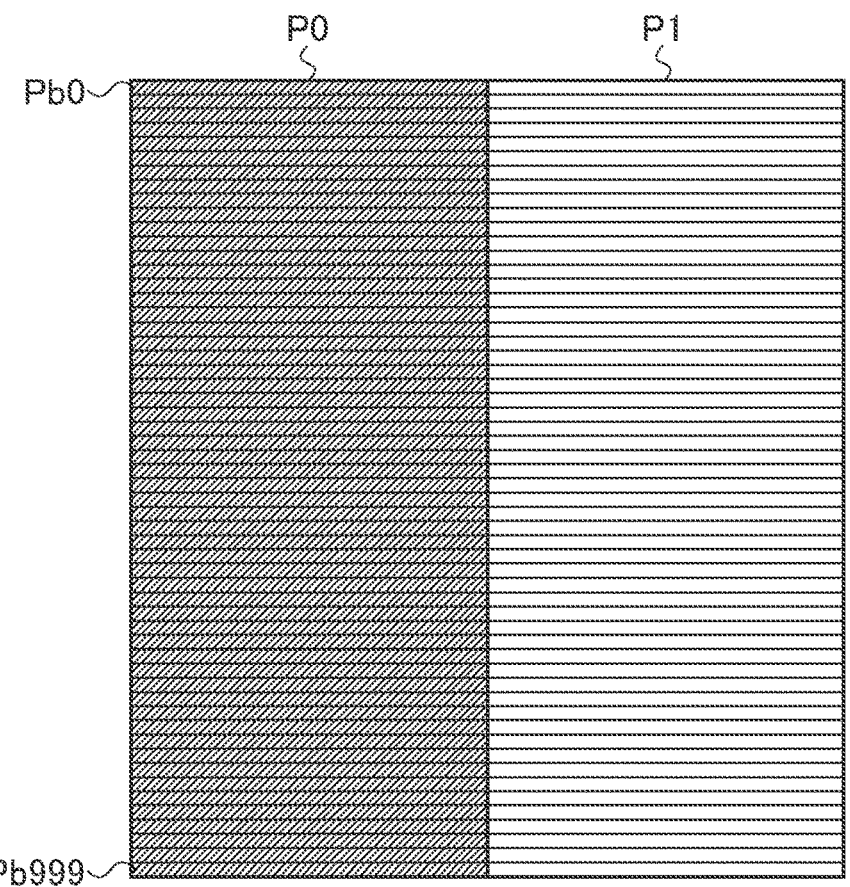
FIG. 13A is a diagram illustrating a block map of a failure of a plane P0 in the failure analysis system of the semiconductor device according to embodiments.
Figure 13B:
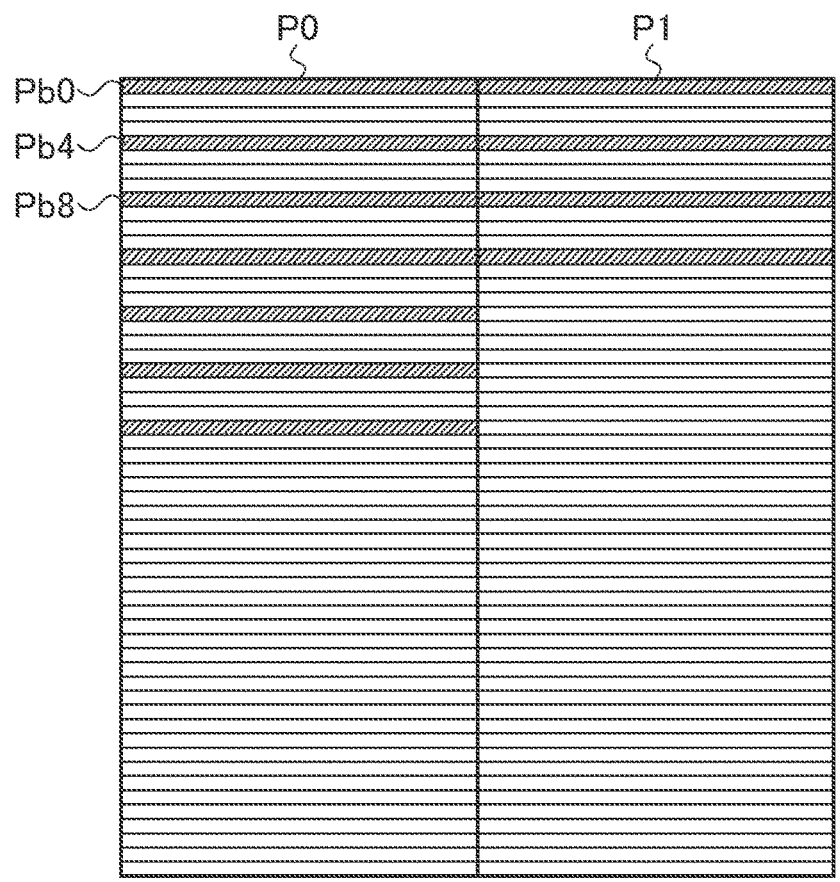
FIG. 13B is a diagram illustrating a block map of a failure in four block cycle in the failure analysis system of the semiconductor device according to embodiments.

The map information creation unit 22 creates a block map as illustrated in FIGS. 13A and 13B, using the converted physical block address (Step S18). The information display unit 24 displays the block map created by the map information creation unit 22. FIG. 13A illustrates a map in which whole blocks Pb0 to Pb999 in the plane P0 are failure. FIG. 13B illustrates a map of blocks Pb0, Pb4, Pb8 . . . which are failure in a four-block cycle.

The map information creation unit 22 converts the logical column address stored in the column table 19c illustrated FIG. 7C into the physical column address information, with reference to the column logical-to-physical address conversion table 20 illustrated in FIG. 11, and creates a column map as illustrated in FIGS. 14A and 14B (Step S18). FIG. 14A illustrates a map in which a plurality of columns Pc0, Pc1, Pc2 . . . at the right and left ends of the planes P0, P1 are failure. FIG. 14B illustrates a map in which every other column Pc0, Pc2, Pc4 . . . on the left side of the planes P0, P1 is failure.

Figure 15A:
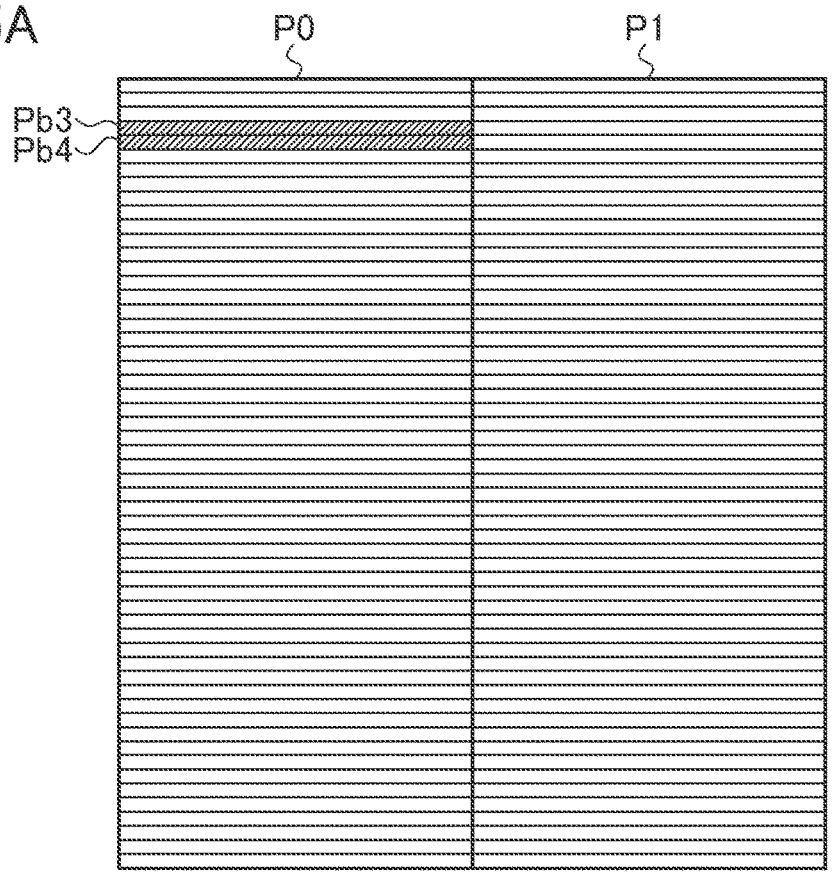
FIG. 15A is a diagram illustrating a block map of a test BA in pre-process in the failure analysis system of the semiconductor device according to embodiments.
Figure 15B:
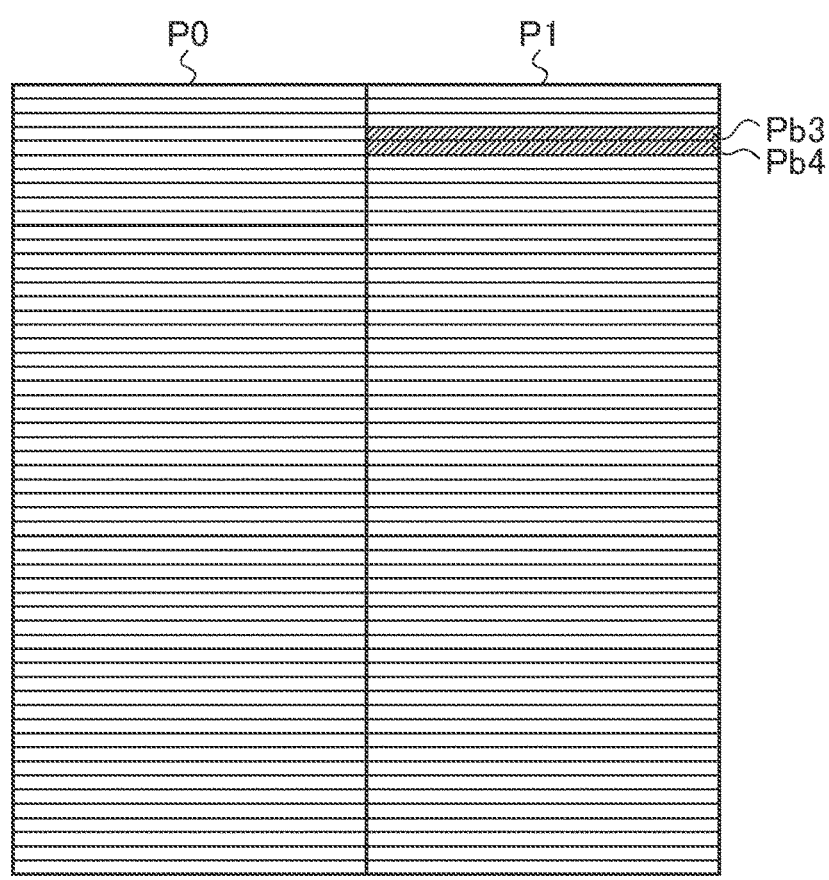
FIG. 15B is a diagram illustrating a block map of a test ba in post-process in the failure analysis system of the semiconductor device according to embodiments.

FIG. 15 illustrates an example of superposition between a plurality of block maps at a chip level, in the failure analysis system of the semiconductor device according to embodiments. The plurality of failure maps may also be maps created from different plurality of tests of the same processing steps or a map created from different a plurality of tests of different plurality of processing steps.

Figure 15C:
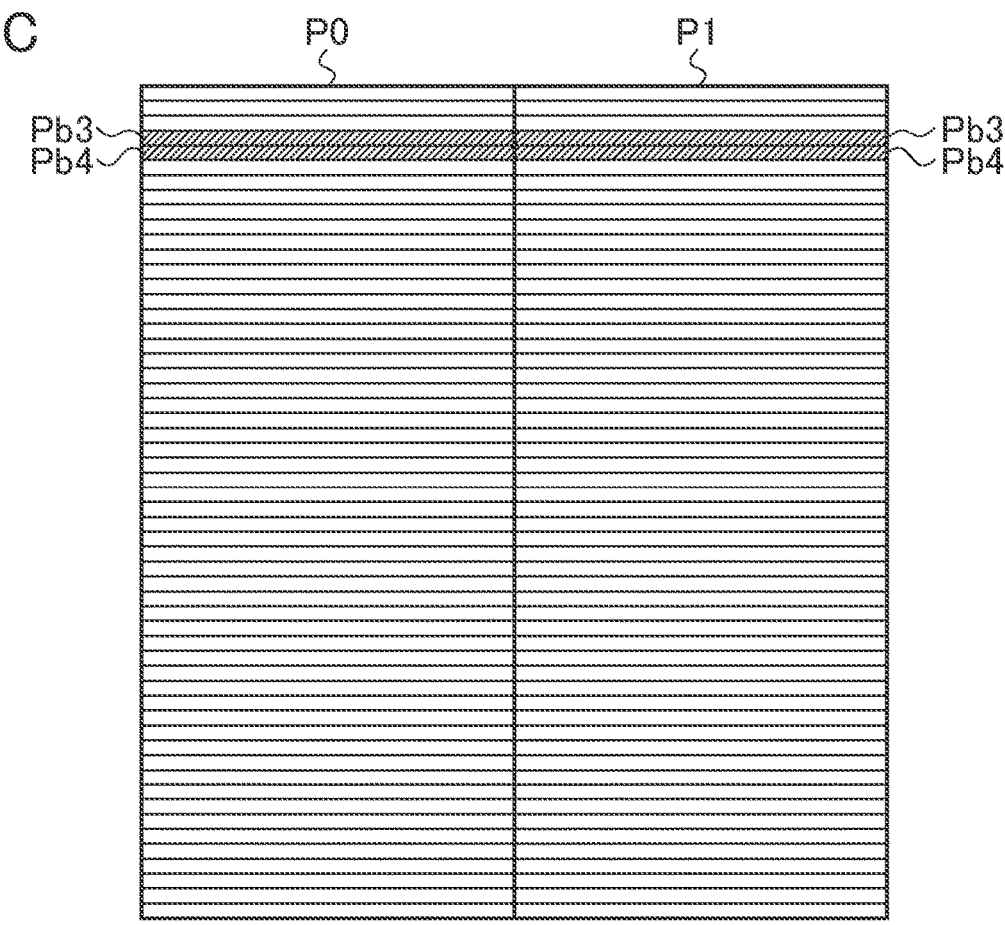
FIG. 15C is a diagram illustrating a superposition between the block map of the test BA in pre-process and the block map of the test ba in post-process, in the failure analysis system of the semiconductor device according to embodiments.

FIG. 15A is a diagram illustrating a block map of a test BA in pre-process in the failure analysis system of the semiconductor device according to embodiments. FIG. 15A is a diagram illustrating a block map of a test ba in pre-process in the failure analysis system of the semiconductor device according to embodiments. As illustrated in FIG. 15C, the information display unit 24 displays a map created by superimposing two block maps and color-coding the failures of both (Step S19).

A map of fail block Pb3 and Pb4 is illustrated for the plane P0 in the test BA in the pre-process, and a map of fail block Pb3 and Pb4 is illustrated for the plane P1 in the test ba in the post-process. When both maps are superimposed, it is proved at a glance that the normal/fail blocks are located in the same physical block addresses ranging over the planes P0 and P1. In this way, by superimposing the plurality of results of the tests in the plurality of processing steps, highly accurate failure analysis can be realized.

(Display of Wafer Map)

FIG. 16 illustrates an example of wafer maps in the failure analysis system of the semiconductor device according to embodiments. FIG. 16A illustrates an example of a wafer map of fail blocks in a monitor test BA in the pre-process of fabrication, in the failure analysis system of the semiconductor device according to embodiments. The fail blocks exist in the X direction. Each chip is represented by reference sign CPXY in accordance with chip XY coordinates (chip addresses). For example, if X=5 and Y=8, the chip XY coordinates (chip address) of the chip can be expressed as CP58. The map information creation unit 22 creates a wafer map by arranging the fail block map of each chip in accordance with the chip XY coordinates (chip addresses) in the wafer surface (Step S20). The information display unit 24 displays the wafer map created by the map information creation unit 22 (Step S21).

Figure 16B:
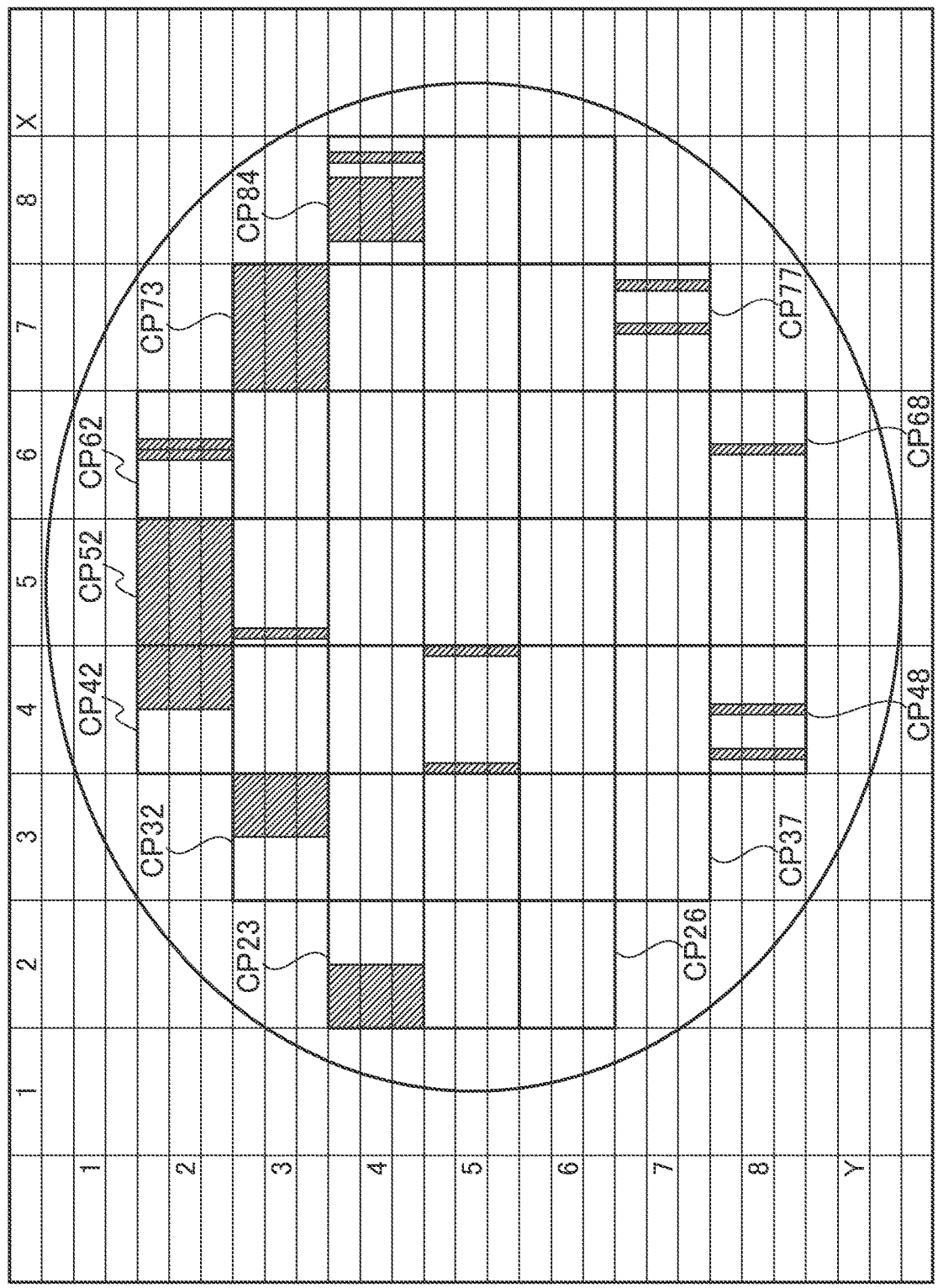
FIG. 16B is a diagram illustrating an example of a wafer map of fail columns, in the failure analysis system of the semiconductor device according to embodiments.

FIG. 16B shows an example of a wafer map of fail columns in the failure analysis system of the semiconductor device according to embodiments. The fail columns exist in the Y direction. The map information creation unit 22 creates a wafer map by arranging the fail columns map of each chip in accordance with the chip XY coordinates in the wafer surface. The information display unit 24 displays the wafer map created by the map information creation unit 22.

Figure 16C:
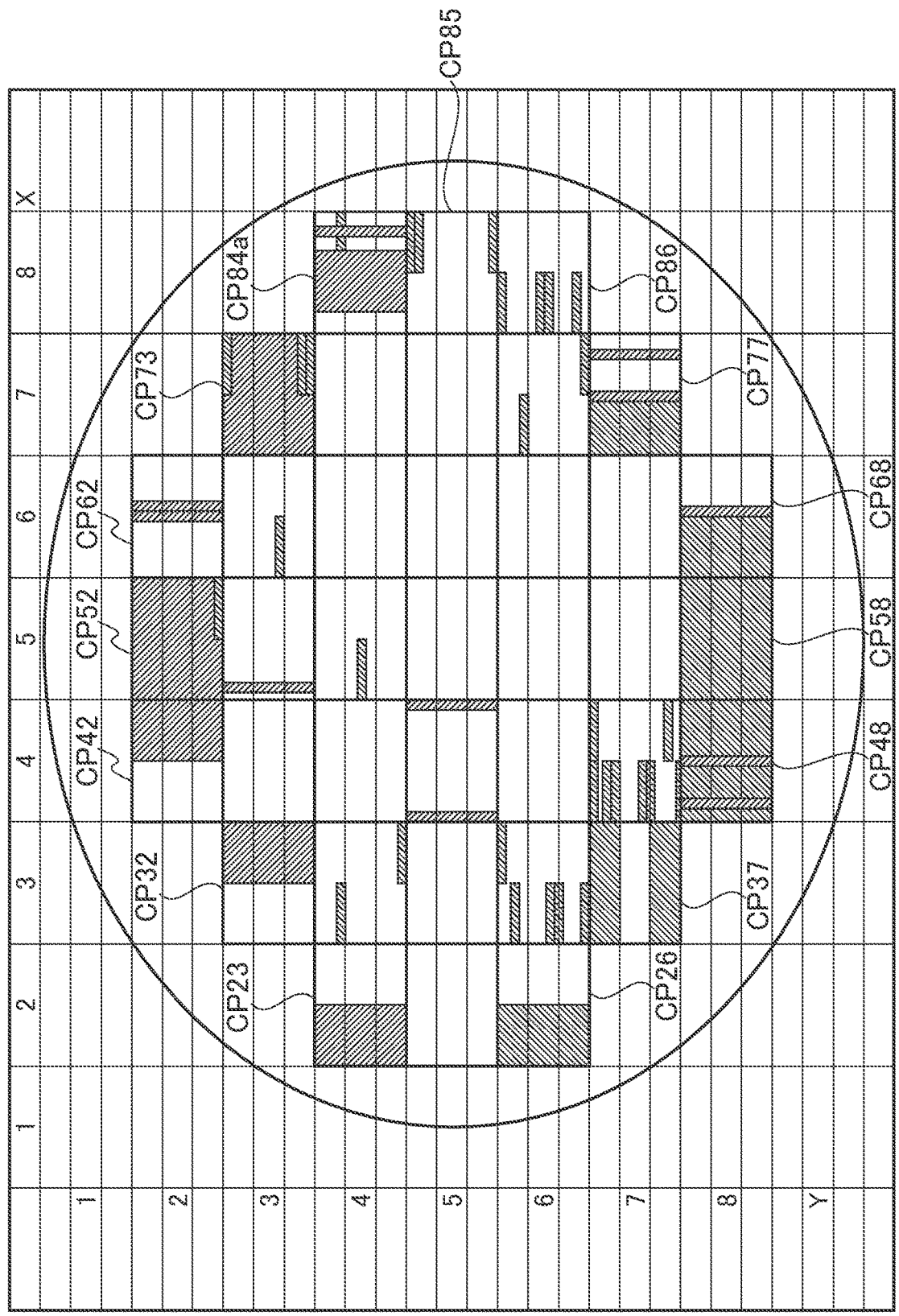
FIG. 16C is a diagram illustrating an example of a wafer map displayed by superimposing the fail blocks and the fail columns, in the failure analysis system of the semiconductor device according to embodiments.

FIG. 16C illustrates an example of a wafer map displayed by superimposing the fail blocks and the fail columns, in the failure analysis system of the semiconductor device according to embodiments. The map information creation unit 22 creates a wafer map by arranging the fail block map and the fail column map of each chip in accordance with the chip XY coordinates in the wafer surface (Step S20). The information display unit 24 displays the wafer map created by the map information creation unit 22 (Step S21).

The wafer map can also be created by superimposing maps of a plurality of tests in a plurality of processing steps. Failure occurring due to exposure, immersion, or the like in semiconductor fabrication processes may occur not on a chip-by-chip basis, but over a wide area on a wafer, and therefore failure analysis using such a wafer map is effective.

Figure 16D:
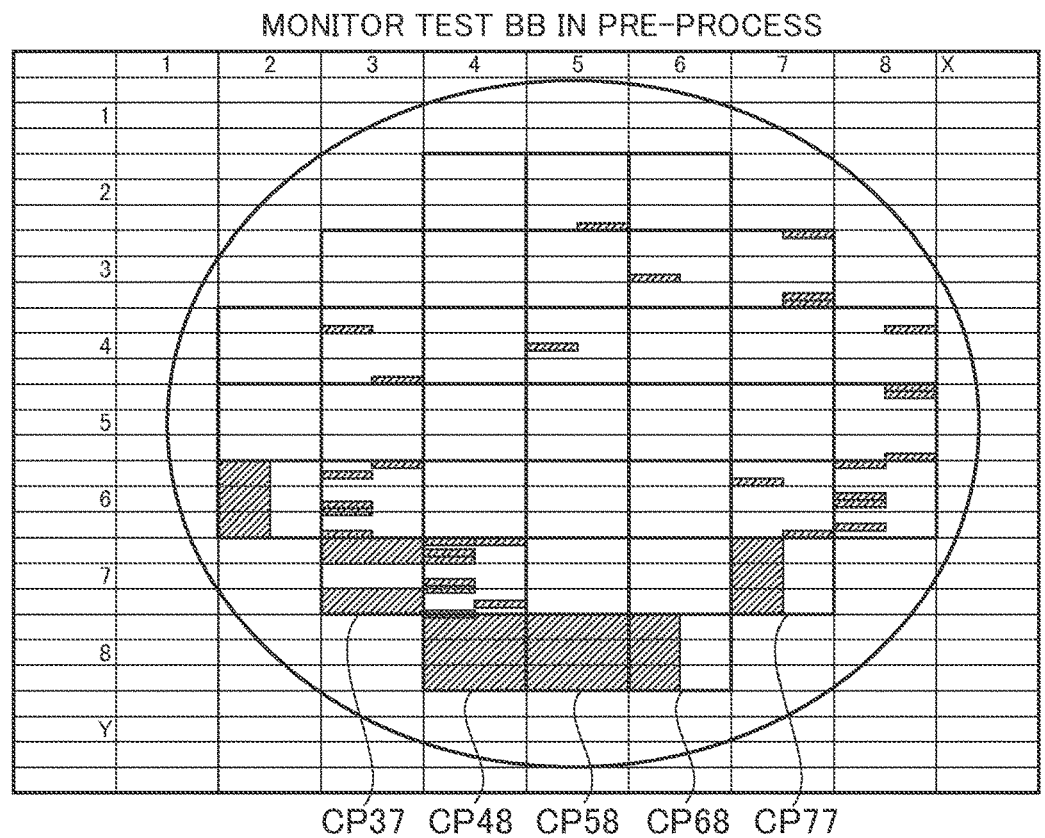
FIG. 16D is a diagram illustrating a wafer map of fail blocks in a monitor test BB in the pre-process of fabrication, in the failure analysis system of the semiconductor device according to embodiments.
Figure 16E:
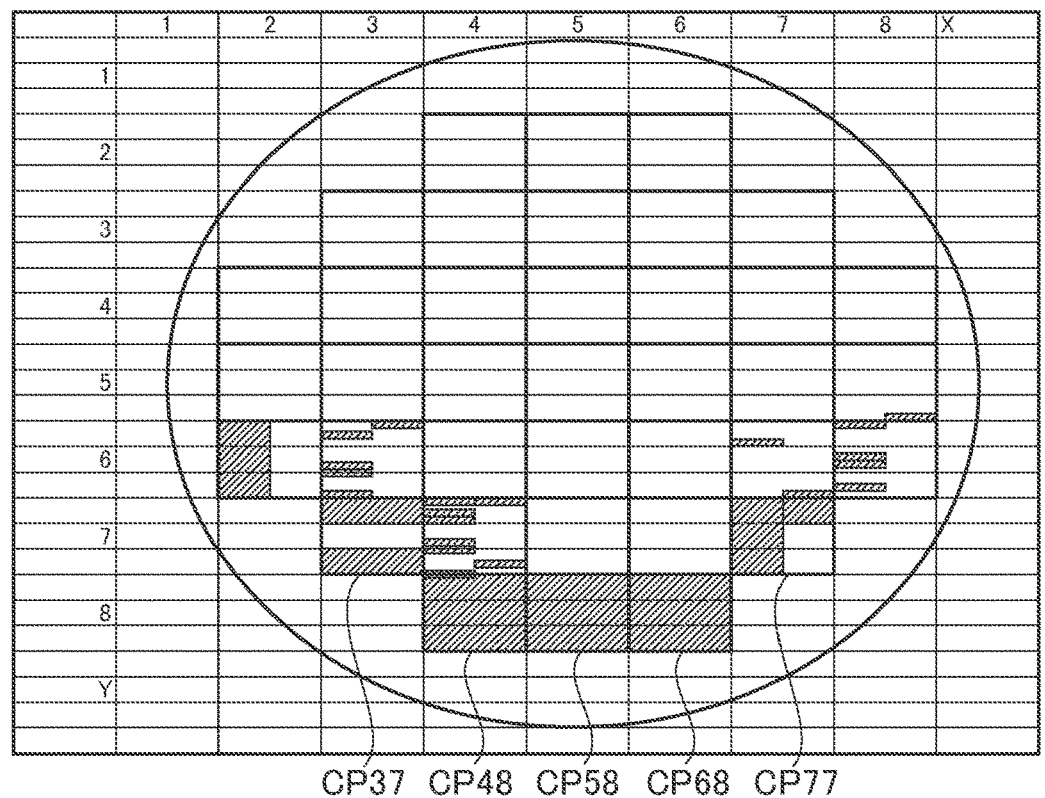
FIG. 16E is a diagram illustrating a wafer map of fail blocks in a regular test ba in the post-process of fabrication, in the failure analysis system of the semiconductor device according to embodiments.

FIG. 16D illustrates an example of a wafer map of fail blocks in a monitor test BB in the pre-process of fabrication, in the failure analysis system of the semiconductor device according to embodiments. FIG. 16E illustrates an example of a wafer map of fail blocks in a regular test ba in the post-process of fabrication, in the failure analysis system of the semiconductor device according to embodiments. In both wafer maps, failures occur frequently near a lower outer periphery of the wafer, and the occurrence tendency is very similar. In this case, the monitor test BB in the pre-process is carefully examined and the monitor test BB is changed into a regular test as required.

As a result, the block that is initially determined to be failure in the regular test ba in the post-process can be determined to be failure in the pre-process. If failures can be determined in the pre-process, it becomes easy to conduct yield analysis on the wafer state, and thereby assembly costs and test costs in the post-process can be reduced.

(Summary Table including Inspection Apparatus Information)

FIG. 17 is a diagram illustrating an example of a summary table including inspection apparatus information, in the failure analysis system of the semiconductor device according to embodiments. Inspection apparatus information is added to the items in the summary table 19a illustrated in FIG. 7A. As the inspection apparatus information, an inspection apparatus name is provided in advance into the tester collection information file 8 illustrated in FIG. 6 to be registered in the summary table 19a. By verifying the information in the summary table 19a using the inspection apparatus information and the starting date and time of inspection as search keys, it is possible to analyze the failures caused by the inspection apparatus.

(Summary Table Including Fabricating Apparatus Information and Fabricating Date Information)

FIG. 18 illustrates an example of a summary table including process conditions, fabricating apparatus information, and fabricating date information, in the failure analysis system of the semiconductor device according to embodiments. Information on the process conditions, the fabricating apparatus, and the date and time of fabrication is added to the items of the summary table 19a illustrated in FIG. 7A.

The information adding unit 16 uses the product information, such as the product name A, the lot number L1, and the wafer number W1, as search keys, and searches the production management database 17 to obtain the information on the process conditions, the fabricating apparatus, and the date and time of fabrication. The information registration/analysis unit 18 registers the obtained information on the process conditions, the fabricating apparatus, and the date and time of fabrication in the summary table 19a. The information registration/analysis unit 18 can analyze failures due to the processes by verifying the information stored in the summary table 19a using the process conditions, the fabricating apparatus, and the date and time of fabrication as the search keys.

(Effect of Failure Analysis System of Semiconductor Device)

Thus, in accordance with the failure analysis system of the semiconductor device according to embodiments, the tester output information memory 13 stores the normal/failure information collected in the block unit and column unit in the chip in the inspection in pre-process of semiconductor fabrication, the inspection in post-process of semiconductor fabrication, and the inspection in final process before shipment.

The failure information management table 19 stores the information obtained by adding the product information, the fabricating information, the process information, and the test information to the normal/failure information in the block unit and the column unit. The information registration/analysis unit 18 analyzes the normal/failure information in the block unit and the column unit ranging over the plurality of inspection processes, on the basis of the information stored in the failure information management table 19.

Accordingly, the normal/failure information in the block unit and the column unit, which are relief units can be analyzed in an integrated manner ranging over the plurality of inspection processes, and thereby analysis efficiency can be improved.

Moreover, the logical-to-physical address conversion unit 21 converts the logical address information of fail blocks and fail columns into the physical address information, with reference to the logical-to-physical address conversion table 20 obtained by respectively corresponding the physical addresses of the block and column to the logical addresses of the block and column. Accordingly, physical locations of the fail block and the fail column can be grasped.

Moreover, the map information creation unit 22 creates the fail block map and the fail column map indicating the physical layout in the fail chip on the basis of the physical address information of the fail blocks and the fail columns converted by the logical-to-physical address conversion unit 21. Since the information display unit 24 displays the map by superimposing the fail block map and the fail column map which are created by the map information creation unit 22, the normal/failure in the block unit and the column unit can be analyzed.

Moreover, since the map information creation unit 22 creates the wafer map in which the fail block map and the fail column map of each chip are arranged in the wafer surface on the basis of the chip address information in the wafer surface, the fail block map and the fail column map of each chip can be grasped on the wafer map.

Moreover, the failure information management table 19 stores the information on the fabricating process including the inspection apparatus information, the fabricating apparatus information, and the process information, and the information registration/analysis unit 18 can perform summary and analysis of the number of failures in the block unit and the column unit on the basis of the information stored in the failure information management table 19.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A failure analysis system of a semiconductor device, the failure analysis system comprising:
    a tester configured to:
        in each of a plurality of inspection processes including an inspection in a pre-process on an undivided wafer, an inspection in post-process after dividing the wafer into a plurality of chips, and an inspection in final process of semiconductor fabrication that occurs before shipment of a fabricated semiconductor product,
        perform tests of the semiconductor device including:
            a power source test,
            a data transfer test that includes transferring data to a chip of the semiconductor device,
            a leakage test,
            an open test,
            an erasing test that includes erasing data from the chip, and
            a program test including programming the chip;
        output all addresses of fail blocks or fail columns after conducting one of the tests for determination of normal/failure in a block unit or normal/failure in a column unit in the chip; and
        identify a fail block or a fail column occurring during the one of the tests on the basis of a difference between fail address information at an end of the one of the tests and fail address information at an end of an immediately previous test of the tests, and
    a data management server connected to a tester collection information file in which information output by the tester is stored, the data management server including:
        a receiving unit configured to:
            receive, from the tester collection information file, normal/failure information in the block unit and the column unit in the chip in each of the plurality of the inspection processes, and
            store the received normal/failure information in a memory;
        an information adding unit configured to store, in a failure information management table, the normal/failure information in the block unit and the column unit stored in the memory, with an addition of product information, fabricating information including a lot number, a wafer number, and a chip address, process information, and test information, which are common information ranging over the inspection processes; and
        an analyzing unit configured to integratively analyze the normal/failure information in the block unit and the column unit ranging over the plurality of the inspection processes on the basis of the information stored in the failure information management table, wherein
    the tester identifies the fail block or the fail column newly occurring during the one of the tests by removing the fail address information at the end of the immediately previous test of the tests from the fail address information at the end of the one of the tests, and thereby collects normal/failure information of the block and normal/failure information of the column in the plurality of inspection processes and output the collected normal/failure information of the block and normal/failure information of the column to the tester collection information file, and
    wherein the test information includes at least information used for distinguishing between a regular test for determining normal/failure in a fabricating process and a monitor test in which conditions are accelerated in order to grasp a true capability of the semiconductor device, and the analyzing unit is configured to integratively analyze the normal/failure information in the block unit by determining that a block unit that is initially determined to be a failure in a regular test in post-process inspection is automatically determined to be a failure in pre-process inspection.

2. The failure analysis system according to claim 1, wherein
    the data management server further comprises a logical-to-physical address conversion table created by corresponding logical addresses of a block and a column of each product to physical addresses of the block and the column indicating a layout on the chip,
    the analyzing unit stores logical address information of the fail block or the fail column, and
    the data management server further comprises a logical-to-physical address conversion unit configured to convert the logical address information of the fail block and the fail column, stored in the failure information management table, into physical address information, with reference to the logical-to-physical address conversion table.

3. The failure analysis system according to claim 2, wherein the data management server further comprises:
    a map creation unit configured to create a fail block map and a fail column map indicating a physical layout in a fail chip on the basis of the physical address information of the fail block and the fail column of each of the inspection processes and each of the tests converted by the logical-to-physical address conversion unit; and
    a map display unit configured to display a map created by superimposing the fail block map and the fail column map, both created by the map creation unit.

4. The failure analysis system according to claim 3, wherein the map creation unit creates a wafer map in which the fail block map and the fail column map of each chip are arranged in a wafer surface on the basis of chip address information in the wafer surface.

5. The failure analysis system according to claim 1, wherein
    the failure information management table stores information on a fabricating process including inspection apparatus information, fabricating apparatus information, and process information, and
    the analyzing unit performs a summary and an analysis of a number of failures in the block unit and the column unit on the basis of the information stored in the failure information management table.

6. A failure analysis method of a semiconductor device, the failure analysis method comprising:

in each of a plurality of inspection processes including an inspection in a pre-process on an undivided wafer, an inspection in post-process after dividing the wafer into a plurality of chips, and an inspection in final process of semiconductor fabrication that occurs before shipment of a fabricated semiconductor product, performing, by a tester, tests of the semiconductor device including:
  a power source test,
  a data transfer test that includes transferring data to a chip of the semiconductor device,
  a leakage test,
  an open test,
  an erasing test that includes erasing data from the chip, and
  a program test including programming the chip;

outputting, by the tester, all addresses of fail blocks or fail columns after conducting one of the tests for determination of normal/failure in a block unit or normal/failure in a column unit in the chip;

identifying, by the tester, a fail block or a fail column occurring during the one of the tests on the basis of a difference between fail address information at an end of the one of the tests and fail address information at an end of an immediately previous test of the tests;

receiving, from a tester collection information file in which information of the tester is stored, normal/failure information in the block unit and the column unit in the chip in each of the plurality of the inspection processes;

storing the received normal/failure information in a memory;

creating a failure information management table configured to store the normal/failure information in the block unit and the column unit stored in the memory, with an addition of product information, fabricating information including a lot number, a wafer number, and a chip address, process information, and test information, which are common information ranging over the inspection processes; and integratively analyzing, by an analyzing unit, the normal/failure information in the block unit and the column unit ranging over the plurality of the inspection processes on the basis of the information stored in the failure information management table, wherein the tester identifies the fail block or the fail column newly occurring during the one of the tests by removing the fail address information at the end of the immediately previous test of the tests from the fail address information at the end of the one of the tests, and thereby collects normal/failure information of the block and normal/failure information of the column in the plurality of inspection processes and output the collected normal/failure information of the block and normal/failure information of the column to the tester collection information file, and wherein the test information includes at least information used for distinguishing between a regular test for determining normal/failure in a fabricating process and a monitor test in which conditions are accelerated in order to grasp a true capability of the semiconductor device, and the analyzing unit is configured to integratively analyze the normal/failure information in the block unit by determining that a block unit that is initially determined to be a failure in a regular test in post-process inspection is automatically determined to be a failure in pre-process inspection.

7. The failure analysis method according to claim 6, further comprising:

storing logical address information of the fail block and the fail column in the failure information management table, and converting, by a logical-to-physical address conversion unit, the logical address information of the fail block and the fail column, stored in the failure information management table, into physical address information, with reference to a logical-to-physical address conversion table that corresponds logical addresses of a block and a column of each product to physical addresses of the block and the column indicating a layout on the chip.

8. The failure analysis method according to claim 7, further comprising:

creating, by a map creation unit, a fail block map and a fail column map indicating a physical layout in a fail chip on the basis of the physical address information of the fail block and the fail column of each of the inspection processes and each of the tests converted by the logical-to-physical address conversion unit; and displaying a map created by superimposing the fail block map and the fail column map both created by the map creation unit.

9. The failure analysis method according to claim 8, further comprising creating, by the map creation unit, a wafer map in which the fail block map and the fail column map of each chip are arranged in a wafer surface on the basis of chip address information in the wafer surface.

10. The failure analysis method according to claim 6, wherein the failure information management table stores information on a fabricating process including inspection apparatus information, fabricating apparatus information, and process information, and the analyzing includes performing a summary and an analysis of a number of failures in the block unit and the column unit on the basis of the information stored in the failure information management table.

11. A failure analysis system of a semiconductor device, the failure analysis system comprising:

a tester configured to:
  in each of a plurality of inspection processes including an inspection in a pre-process on an undivided wafer, an inspection in post-process after dividing the wafer into a plurality of chips, and an inspection in final process of semiconductor fabrication that occurs before shipment of a fabricated semiconductor product,
  perform tests of the semiconductor device including:
    a power source test,
    a data transfer test that includes transferring data to a chip of the semiconductor device,
    a leakage test,
    an open test,
    an erasing test that includes erasing data from the chip, and
    a program test including programming the chip;
  output all addresses of fail blocks or fail columns after conducting one of the tests for determination of normal/failure in a block unit or normal/failure in a column unit in the chip; and
  identify a fail block or a fail column occurring during the one of the tests on the basis of a difference between fail address information at an end of the one of the tests and fail address information at an end of an immediately previous test of the tests, and a non-transitory computer readable medium in which a computer program is stored, the computer program being executed by a computer and causing the computer to perform a method including:

receiving, from a tester collection information file in which information of the tester is stored, normal/failure information in the block unit and the column unit in the chip in each of the plurality of the inspection processes;

storing the received normal/failure information in a memory;

creating a failure information management table configured to store the normal/failure information in the block unit and the column unit stored in the memory, with an addition of product information, fabricating information including a lot number, a wafer number, and a chip address, process information, and test information, which are common information ranging over the inspection processes; and integratively analyzing the normal/failure information in the block unit and the column unit ranging over the plurality of the inspection processes on the basis of the information stored in the failure information management table, wherein the tester identifies the fail block or the fail column newly occurring during the one of the tests by removing the fail address information at the end of the immediately previous test of the tests from the fail address information at the end of the one of the tests, and thereby collects normal/failure information of the block and normal/failure information of the column in the plurality of inspection processes and output the collected normal/failure information of the block and normal/failure information of the column to the tester collection information file, and wherein the test information includes at least information used for distinguishing between a regular test for determining normal/failure in a fabricating process and a monitor test in which conditions are accelerated in order to grasp a true capability of the semiconductor device, and an analyzing unit is configured to integratively analyze the normal/failure information in the block unit by determining that a block unit that is initially determined to be a failure in a regular test in post-process inspection is automatically determined to be a failure in pre-process inspection.

12. The failure analysis system according to claim 11, further comprising:

a logical-to-physical address conversion table created by corresponding logical addresses of a block and a column of each product to physical addresses of the block and the column indicating a layout on the chip, wherein the failure information management table stores logical address information of the fail block and the fail column, and the computer program causes the computer to perform the method further including converting the logical address information of the fail block and the fail column, stored in the failure information management table, into physical address information, with reference to the logical-to-physical address conversion table.

13. The failure analysis system according to claim 12, wherein the computer program causes the computer to perform the method further comprising:

creating a fail block map and a fail column map indicating a physical layout in a fail chip on the basis of the physical address information of the fail block and the fail column of each of the inspection processes and each of the tests; and displaying a map created by superimposing the fail block map and the fail column map.

14. The failure analysis system according to claim 13, wherein the computer program causes the computer to perform the method further comprising creating a wafer map in which the fail block map and the fail column map of each chip are arranged in a wafer surface on the basis of chip address information in the wafer surface.

15. The failure analysis system according to claim 11, wherein the failure information management table stores information on a fabricating process including inspection apparatus information, fabricating apparatus information, and process information, and the analyzing includes performing a summary and an analysis of a number of failures in the block unit and the column unit on the basis of the information stored in the failure information management table.

16. The failure analysis system according to claim 11, wherein the test information includes at least information used for distinguishing between a regular test for determining normal/failure in a fabricating process and a monitor test in which conditions are accelerated in order to grasp a true capability of the semiconductor device.

17. The defect analysis system according to claim 1, wherein the tester is configured to change the monitor test to the regular test to be performed.

18. The defect analysis system according to claim 1, wherein the analysis unit registers information on a pass chip and a pass plane without a fail block or a fail column, in the failure information management table, as a number of failures being "0".

* * * * *